United States Patent
Wong et al.

(10) Patent No.: US 9,954,123 B2
(45) Date of Patent: Apr. 24, 2018

(54) MULTIFUNCTIONAL NANOSTRUCTURED METAL-RICH METAL OXIDES

(71) Applicant: The Trustees of Dartmouth College, Hanover, NH (US)

(72) Inventors: Andrew Wong, Hanover, NH (US); Jifeng Liu, Hanover, NH (US)

(73) Assignee: THE TRUSTEES OF DARTMOUTH COLLEGE, Hanover, NH (US)

( * ) Notice: Subject to any disclaimer, the term of this patent is extended or adjusted under 35 U.S.C. 154(b) by 128 days.

(21) Appl. No.: 14/777,048

(22) PCT Filed: Mar. 10, 2014

(86) PCT No.: PCT/US2014/022657
§ 371 (c)(1),
(2) Date: Sep. 15, 2015

(87) PCT Pub. No.: WO2014/150235
PCT Pub. Date: Sep. 25, 2014

(65) Prior Publication Data
US 2016/0035916 A1    Feb. 4, 2016

Related U.S. Application Data

(60) Provisional application No. 61/788,585, filed on Mar. 15, 2013.

(51) Int. Cl.
*H01L 31/0224* (2006.01)
*H01B 1/08* (2006.01)
(Continued)

(52) U.S. Cl.
CPC ....... *H01L 31/022466* (2013.01); *H01B 1/08* (2013.01); *H01L 31/02168* (2013.01);
(Continued)

(58) Field of Classification Search
CPC ..... H01L 31/022466; H01L 31/022475; H01L 31/022491; H01L 31/1884
See application file for complete search history.

(56) References Cited

U.S. PATENT DOCUMENTS 6,743,488 B2 * 6/2004 Memarian ........... C23C 14/0036
257/E31.126
2005/0092359 A1 5/2005 Uchida et al.
(Continued)

OTHER PUBLICATIONS

Alpuim (Mar. 17-19, 2010) "Thin film slicone solar cells and modules," in; The 4th Mikkeli International Industrial Coating Seminar, 2010. Finland.
(Continued)

*Primary Examiner* — Benjamin Sandvik
(74) *Attorney, Agent, or Firm* — Lathrop Gage LLP

(57) ABSTRACT

A transparent conductive oxide (TCO) material includes a metal-rich metal oxide having an average formula (M1, M2 ... Mn)$_y$O$_x$, where M1, M2 and Mn are the same metal or different metals and a molar ratio of y:x is selected from a range of 0.1 to 20. A method of making a metal-rich metal oxide material includes co-depositing a metal and a stoichiometric metal oxide and annealing the deposited material above 100° C. In an embodiment, a thin-film solar cell, includes an electrode, a transparent conductive oxide (TCO) disposed on the electrode, a solar absorbing layer disposed on the TCO, and a metal-rich metal oxide disposed on the solar absorbing layer. A method of fabricating a thin-film solar cell is also disclosed.

10 Claims, 13 Drawing Sheets

(51) Int. Cl.
H01L 31/0216 (2014.01)
H01L 31/18 (2006.01)
H01L 31/056 (2014.01)
H01L 31/054 (2014.01)

(52) U.S. Cl.
CPC .... *H01L 31/022425* (2013.01); *H01L 31/056* (2014.12); *H01L 31/0543* (2014.12); *H01L 31/1884* (2013.01); *Y02E 10/52* (2013.01)

(56) References Cited

U.S. PATENT DOCUMENTS

| | | | | |
|---|---|---|---|---|
| 2008/0152868 | A1* | 6/2008 | Sato | C23C 16/0272 428/142 |
| 2009/0053511 | A1* | 2/2009 | Kim | B32B 17/10036 428/332 |
| 2009/0253227 | A1* | 10/2009 | Defries | H01L 31/02168 438/72 |
| 2010/0003781 | A1* | 1/2010 | Van Duren | H01L 31/1884 438/98 |
| 2010/0133639 | A1* | 6/2010 | Fuechsel | H01L 31/0236 257/458 |
| 2010/0288351 | A1 | 11/2010 | Speit et al. | |
| 2011/0036399 | A1* | 2/2011 | Lin | H01L 31/02366 136/256 |
| 2011/0076556 | A1 | 3/2011 | Karthikeyan et al. | |
| 2011/0294254 | A1 | 12/2011 | Jackrel et al. | |
| 2012/0015147 | A1* | 1/2012 | Maa | H01L 31/0236 428/148 |
| 2012/0225250 | A1* | 9/2012 | Kuznetsov | C23C 18/08 428/156 |
| 2012/0275008 | A1* | 11/2012 | Pradhan | G02F 1/1525 359/265 |
| 2012/0279564 | A1* | 11/2012 | Abe | C04B 35/01 136/256 |

OTHER PUBLICATIONS

Alves et al. (2010) "High Efficiency Solar Coatings," Novus Media Today. Accessible on the Internet at URL: http://www.depsci.com/wp-content/uploads/2016/02/DSI-High-Efficiency-Solar-Coatings.pdf. [Last Accessed May 31, 2016].
Aurbach et al. (2002) "Nanoparticles of SnO Produced by Sonochemistry as Anode Materials for Rechargeable Lithium Batteries," Chem. Mater. 14:4155-4163.
Cahen et al. (2003) "Thermodynamic modelling of the 0—Sn system," Thermochim. Acta. 403:275-285.
Forster (2004) "Theoretical investigation of the system SnOx/Sn for the thermochemical storage of solar energy," Energy. 29:789-799.
Forthaus et al. (Oct. 2010) "Superconductivity in SnO: A Nonmagnetic Analog to Fe-Based Superconductors?" Physical Review Letters. 105:157001. pp. 1-4.
Fortunato (2007) "Transparent Conducting Oxides for Photovoltaics," MRS Bulletin. 32:242-247.
Geurts et al. (1984) "SnO films and their oxidation to SnO 2: Raman scattering, IR reflectivity and X-ray diffraction studies," Thin Solid Films. 121:217-225.
Giefers et al. (2005) "Kinetics of the disproportionation of SnO," Solid State Ionics. 176:199-207.
Granqvist et al. (2002) "Transparent and conducting ITO films: new developments and applications," Thin Solid Films. 411:1-5.
Han et al. (2001) "Solvothermal preparation and morphological evolution of stannous oxide powders," Mater. Lett. 48:99-103.
Hoffmann et al. (Apr. 2011) "Thin films in photovoltaics: Technologies and perspectives," Thin Solid Films. 520:4094-4100.

Iqbal et al. (2012) "Facile synthesis of self-assembled SnO nano-square sheets and hydrogen absorption characteristics," Mater. Res. Bull. 47:3902-3907.
Iqbal et al. (Mar. 2013) "Synthesis and electrochemical properties of stannous oxide clinopinacoid as anode material for lithium ion batteries," J. Nanosci. Nanotechnol. 13:1773-1779.
Izumi (1981) "Pattern-fitting structure refinement of tin(II) oxide," Journal of Solid State Chemistry. 38:381-385.
Jia et al. (2004) "Preparation and characterization of SnO nanowhiskers," Solid. State. Commun. 132:79-82.
Kilic et al. (2002) "Origins of Coexistence of Conductivity and Transparency in SnO2," Physical Review Letters. 88:095501. pp. 1-4.
King et al. (Aug. 2, 2011) "Conductivity in transparent oxide semiconductors," Journal of Physics.: Condensed Matter. 23:334214. pp. 1-17.
Köhler et al. (Oct. 2012) "Crystal Structure and Electronic Structure of Red SnO," Zeitschrift für Anorganisch and Allgemeine Chemie. 638:1970-1975.
Kumar et al. (2010) "General Route to Single-Crystalline SnO Nanosheets on Arbitrary Substrates," J. Phys. Chem. C. 114:11050-11055.
Liu et al. (Jan. 18, 2012) "Room-temperature synthesis, photoluminescence and photocatalytic properties of SnO nanosheet-based flowerlike architectures," Appl. Phys. A 107:437-443.
Muller et al. (2004) "TCO and light trapping in silicon thin film solar cells," Solar Energy. 77(16):917-930.
Ogo et al. (2008) "p-channel thin-film transistor using p-type oxide semiconductor, SnO," Appl. Phys. Lett. 93:032113. pp. 1-3.
Orlandi et al. (2006) "Growth of SnO Nanobelts and Dendrites by a Self-Catalytic VLS Process," J. Phys. Chem. B 110:6621-6625.
Pan et al. (2001) "Tin Oxide Thin Films Grown on the (1012) Sapphire Substrate," J. Electroceram. 7:35-46.
Pannetier et al. (1980) "Tin (II) oxide: structure refinement and thermal expansion," Acta. Cryst. B36:2763-2765.
Rao et al. (2005) "Recognizing Nano SnO as an Electrode Material for Electrochemical Double Layer Capacitors," Chem. Lett. 34:712-713.
Rockett (Dec. 2010) "The future of energy—Photovoltaics," Current Opinion in Solid State and Materials Science. 14(16):117-122.
Sivaramasubramaniam et al. (1993) "Optical Properties of Annealed Tin(II) Oxide in Different Ambients," Phys. Stat. Sol. A. 136:215-222.
Soares et al. (1992) "Influence of sputtering parameters on the composition and crystallinity of tin oxide," Thin Solid Films. 214:6-16.
Stjerna (1990) "Characterization of RF-sputtered SnOx thin films by electron microscopy, Hall-effect measurement, and Mössbauer spectrometry," J. Appl. Phys. 68:6241-6245.
Varley et al. (Aug. 23, 2013) "Ambipolar doping in SnO," Applied Physics Letters. 103(8):082118.
Wang et al. (2002) "Junctions and Networks of SnO Nanoribbons," Adv. Mater. 14:1029-1032.
Wang et al. (2005) "Solution route to single crystalline SnO platelets with tunable shapes," Chem. Commun. 2005:507-509.
Wong (Jun. 5, 2012) "Self-Assembled Sunlight-Trapping Nanostructures," Thesis. Thayer School of Engineering. Dartmouth College, Jun. 5, 2012.
Xu et al. (2009) "Growth mechanism of cross-like SnO structure synthesized by thermal decomposition," Chem. Phys. Lett. 482:287-290.
Hoel, C.A., et al. "Transparent Conducting Oxides in the ZnO—In2O3—SnO2 System," Chemistry of Materials, vol. 22, pp. 3569-3579, May 13, 2013.
PCT Patent Application PCT/US2014/022657 International Search Report and Written Opinion dated Jul. 1, 2014, 10 pages.

* cited by examiner

MULTIFUNCTIONAL NANOSTRUCTURED METAL-RICH METAL OXIDES

CROSS-REFERENCE TO RELATED APPLICATIONS

This application claims the benefit of priority from U.S. Provisional Patent Application No. 61/788,585, filed Mar. 15, 2013, which is hereby incorporated by reference.

BACKGROUND

Current photovoltaic technology development has grown rapidly in the thin-film sector due to the commercial potential of thin films to be cost competitive with present energy-generating technologies in the near future. Thin-film solar cells demonstrate a large improvement in power generated per cost compared to similar technologies, in large part, due to their significant reduction in material consumption. In traditional bulk solar cells, efficiency increases were obtained by increasing the thickness of the solar absorbing layer. In thin-film solar cells, material reduction is enabled by improved optical and electrical properties including light scattering, light trapping and increased electron-hole collection efficiency.

Thin-film devices, however, still require many layers of materials to increase the absorption of photons and therefore increase the solar cell efficiency. In simple form, for example, amorphous silicon (a-Si) solar cells require first a layer of a metal electrode, then subsequently, a transparent conductive oxide (TCO) layer, an a-Si absorbing layer, another TCO layer, a scattering layer, and finally an antireflective (AR) coating as shown in FIG. 1. These layers are on the order of 10s to 100s of nanometers thick. High efficiency solar cells require many more layers and are stacked with much greater complexity.

As discussed above, TCOs are commonly used as electrodes both above and below the solar absorbing region of thin film solar cells (TFSCs). The TCOs are typically either a mixture of metal oxides (e.g., $In_2O_3/SnO_2$) or a metal oxide containing substitutions of a dopant into a lattice site. In terms of deposition area, $SnO_2$ doped with F or Sb is the most widely used transparent conductive oxide (TCO) material for many energy generation and electronic applications due to its low cost. Currently, high quality $SnO_2$ requires a processing temperature of ~450° C., which limits its applications in amorphous Si (a-Si) and copper indium gallium selenide (CCIGS) TFSCs.

All solar cells use photon absorption to generate electron-hole pairs, which, in turn, generate an electrical current. Photons in materials can be transmitted, reflected or absorbed. To maximize photon absorption it is necessary to reduce transmittance and reflection. The solar absorbing layer is responsible for the generation of electron-hole pairs; the remaining layers are designed to enhance the absorbing layer by techniques such as light scattering, light trapping, and electron-hole collection and transport.

Electrode pairs, one positive and one negative, are used to facilitate electron hole collection and transport; the higher the electrical conductivity of the individual electrodes, the greater the energy conversion efficiency. The metal electrode is typically a high conductivity metal, such as Al. Most metal electrodes are thick enough that they act as light reflectors for solar wavelengths, eliminating most transmission losses. The scattering layer contains nano-features and materials of different refractive indices to scatter light, increasing the mean path length of light, and therefore increasing the probability that photons will be absorbed in the absorbing layer. The two TCO layers are also used as electrodes: the bottom TCO acts as a conducting buffer between the solar absorbing layer and the metal electrode while the top TCO comprises the entire top electrode to allow light to transmit to the solar absorbing layer. The TCO electrodes are almost always inorganic metal oxide (MO) layers due to their transparency and conductivity, as well as their chemical and structural stability. Sometimes one or both of the TCO layers will be textured so as to scatter light in lieu of the scattering layer. Finally, the antireflective (AR) coating causes destructive interference of reflected light thereby reducing reflection losses. Good AR coatings, with multiple layers of precisely controlled material thicknesses, can cut reflection from 25%-45% to <5% (Alves, Lucas et al. High-Efficiency Solar Coatings. Depositions Sciences, Inc. Solar Novus Today, available at www.depsci.com/Documents/News-Room/DSI%20High-Efficiency%20Solar%20Coatings.pdf), greatly increasing light absorption. These three components: electrodes for electron-hole collection and transport, a scattering layer/microstructures for light trapping, and an antireflection coating, are used to maximize light absorption and energy generation in solar cells.

While these components have desirable properties for solar cells, current technology has some serious drawbacks. High conductivity electrodes are necessary to allow current flow from carrier generation; unfortunately, some of the standard TCOs used today contain relatively rare and expensive elements, such as indium in indium tin oxide (ITO). Textured TCO layers can enhance light trapping in the absorbing layer, yet at the cost of increasing surface recombination and reducing carrier collection efficiency. Finally, in an ideal situation, a light scattering layer should be directly adjacent to the active absorbing layer to maximize the scattering effect. In reality, however, light scattering layers are usually separated from the absorbing layer by the TCO layer due to electrical considerations. This greatly compromises the light trapping efficiency.

SUMMARY

The materials, devices and methods disclosed herein address the deficiencies of traditional TCO materials mentioned above by providing multifunctional nanostructured thin-film TCO layers that incorporate light trapping and antireflection coating functionalities into a single conducting layer. By combining light trapping, electrical conductivity and light scattering, this technology eliminates the need for multiple top layers on advanced materials used, for example, in photovoltaics. This technology also has the potential to improve the quality and manufacturability of photovoltaic materials, and has applications in many important optoelectronic and nanophotonic devices. In comparison to current technology, the materials described herein decrease material costs by combining functional layers and are more easily manufactured over large areas due to self-assembly.

Self-assembled multi-functional nanostructured metal oxides (MOs) can be used to improve the power per cost ratio and efficiency of mature solar cell technology. The disclosed MOs combine the function of three widely used PV efficiency-increasing techniques: light scattering, light trapping and high efficiency carrier collection and transport. To the inventors' knowledge, no single layer thin film has yet combined these properties.

Sn-rich SnO is an example of the capabilities of this technology. It has low optical reflection in visible light frequencies which is ideal for solar PV, it has needle-like nanostructures and nano-plasmonic features which scatter light, and it has a high electrical conductivity that is comparable to, if not higher than, state-of-the-art TCO thin films, which improves carrier collection and transport, thereby increasing the efficiency of current generation. Combining functional layers further reduces the material consumption of thin film photovoltaics and other light trapping devices and decreases thin-film manufacturing time, energy and cost.

Self-assembled multi-functional nanostructured metal-rich metal oxides can be produced by existing widely used technologies. For example, film deposition processes, such as physical vapor deposition (PVD) and chemical vapor deposition (CVD), and crystal growth techniques, such as thermal and laser annealing, are already mature, widely used technologies. Therefore the production of materials described herein requires almost no additional manufacturing equipment. In addition to being immediately able to integrate with current production techniques, some metal-rich metal oxides use relatively abundant, inexpensive, low-toxicity materials, such as Sn-rich SnO. These qualities are preferable to those of rare, relatively expensive, toxic TCOs such as ITO. These metal-rich metal oxides could be used in thin film manufacturing and clean energy technologies. For example, the MOs have the potential to push thin-film solar cells to be superiorly cost competitive to current energy generation technologies.

In an embodiment, a transparent conductive oxide (TCO) material includes a metal-rich metal oxide having an average formula $(M1, M2 \ldots Mn)_y O_x$, where M1, M2 and Mn are the same metal or different metals and a molar ratio of y:x is selected from a range of 0.1 to 20. Mn represents the $n^{th}$ metal, where n is an integer greater than 2, or between 3 and 20, or between 3 and 10, or between 3 and 6. For example, the metal-rich metal oxide may be a binary metal oxide, a ternary metal oxide, a quaternary metal oxide, or a metal oxide containing 5 or more metals.

In an embodiment, a method of making a metal-rich metal oxide material includes the steps of co-depositing a metal and a stoichiometric metal oxide and annealing the deposited material above 100° C.

In an embodiment, a thin-film solar cell includes an electrode, a transparent conductive oxide (TCO) disposed on the electrode, a solar absorbing layer disposed on the TCO, and a metal-rich metal oxide, having an average formula $(M1, M2 \ldots Mn)_y O_x$, where M1, M2 and Mn are the same metal or different metals and a molar ratio of y:x is selected from a range of 0.1 to 20, disposed on the solar absorbing layer.

In an embodiment, a method of fabricating a thin-film solar cell includes the steps of providing an electrode, depositing a transparent conductive oxide (TCO) on the electrode, applying a solar absorbing layer on the TCO, and providing a metal-rich metal oxide, having an average formula $(M1, M2 \ldots Mn)_y O_x$, where M1, M2 and Mn are the same metal or different metals and a ratio of y:x is selected from a range of 0.1 to 20, on the solar absorbing layer.

DETAILED DESCRIPTION

Figure 1:
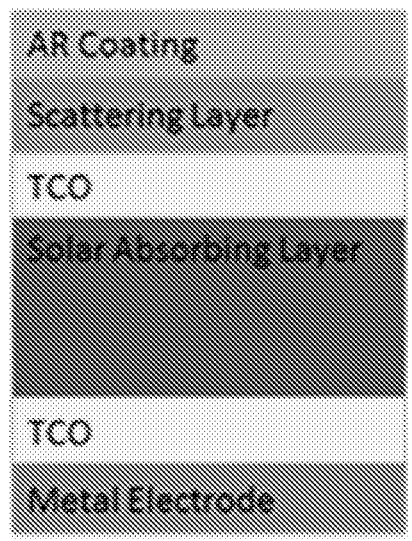
FIG. 1 shows a traditional photovoltaic stack, according to the prior art.

In general, the terms and phrases used herein have their art-recognized meaning, which can be found by reference to standard texts, journal references and contexts known to those skilled in the art. The following definitions are provided to clarify their specific use in the context of this description.

A "device" is a combination of components operably connected to produce one or more desired functions.

A "component" is used broadly to refer to an individual part of a device.

"Phase segregated" materials contain two or more phases, such as crystalline and amorphous phases, or two different crystalline phases. For example, two compositions of matter may phase separate or phase segregate in response to a stimulus into two phases.

"Comproportionation" refers to a chemical reaction where two reactants, each containing the same element but with different oxidation numbers, form a product in which the element reaches the same oxidation number in the product. For example, an element A in the oxidation states 0 and +2 can comproportionate to the +1 state.

"Nanostructured" material is a material having one or more regions of variation (e.g., phase variation, increased or decreased ordering relative to a neighboring region), wherein each region of variation has at least one nanometer-sized physical dimension, i.e., a physical dimension selected from the range of 1-1000 nm. Nanostructured materials include, for example, embedded or partially embedded materials, domains and the like.

"Plasmonic nanostructures" are objects of nanostructured material that support the formation of plasmons, or waves produced by the collective effects of large numbers of electrons disturbed from equilibrium.

"Multifunctional" materials show useful or operational parameters for two or more properties, e.g., optical, electrical, magnetic, structural or other properties.

The terms "embedded" or "encapsulated" refer to the orientation of one structure such that it is at least partially, and in some cases completely, surrounded by one or more other structures. "Partially embedded" or "partially encapsulated" refer to the orientation of one structure such that it is partially surrounded by one or more other structures, for example, wherein 30%, or optionally 50%, or optionally 90%, of the external surfaces of the structure are surrounded by one or more structures. "Completely embedded" or "completely encapsulated" refers to the orientation of one structure such that it is completely surrounded by one or more other structures. Materials disclosed herein include materials having partially or completely embedded or encapsulated nanostructures.

"Domain" refers to a region of a material that is uniform within its boundaries, but different from a neighboring region. For example, a single crystalline material has a single domain.

The terms "direct" and "indirect" describe the actions or physical positions of one component or layer relative to another component or layer, or one device relative to another device. For example, a component or layer that "directly" acts upon or touches another component or layer does so without intervention from an intermediary. Contrarily, a component or layer that "indirectly" acts upon or touches another component or layer does so through an intermediary (e.g., a third component).

Figure 2:
FIG. 2 shows an exemplary metal oxide photovoltaic (PV) stack, according to an embodiment.
Figure 3:
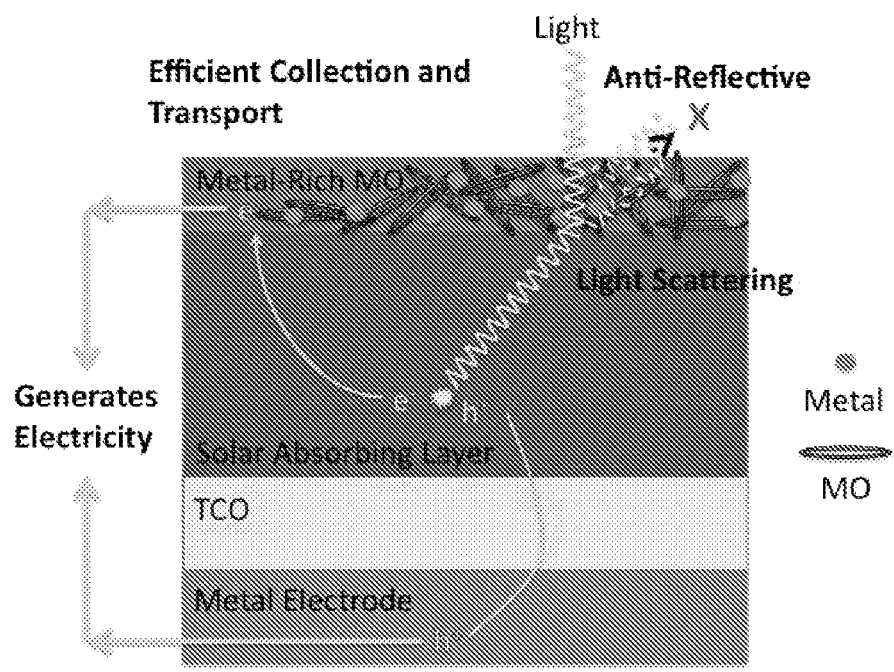
FIG. 3 shows greater structural and functional detail of the PV stack shown in FIG. 2.

Self-assembled nanostructured metal-rich metal oxides have the potential to combine optoelectronic functions, such as light scattering, antireflection and conductivity, in a single thin film layer as shown in FIG. 2. The combination of at least three optoelectronic properties, as shown in FIG. 3, is demonstrated for example in self-assembled Sn-rich SnO (romarchite (y:x>1)). Other dopants and metal oxides may also be used to form metal-rich metal oxides. For example, self-assembled nanostructured metal-rich metal oxide films can include a metal oxide material selected from the group consisting of $Zn_yO_x$, $Cd_yO_x$, $Sn_yO_x$, $In_yO_x$, and doped metal oxides, such as indium doped tin oxide (ITO), iron doped tin oxide, copper doped tin oxide, manganese doped tin oxide, fluorine doped tin oxide (FTO) and aluminum doped zinc oxide (AZO).

The present materials are considered metal-rich in that the metal composition is higher than the stoichiometric compositions in equilibrium phase diagrams. For example, in the case of $Zn_yO_x$, y:x can be greater than 1.

In the formation of self-assembled nanostructures, crystal formation is dictated by spontaneous, energetically favorable growth that forms nano-scale features or nanostructures. The size and orientation of the nano-scale features determine the material's light-interacting properties. As an example, nanostructure formation is demonstrated in Sn-rich SnO as self assembled nano-needles and Sn plasmonic nanostructures. This is shown schematically as a cross section in the metal-rich MO layer in FIG. 3. The metal oxide nanostructures cause optical scattering which further enhances light trapping. The plasmonic nanostructures scatter light via electron gas resonance with the electromagnetic field of different light frequencies. This electric field resonance alters the trajectory of incident photons, scattering them at more obtuse angles through the solar absorbing layer, thereby increasing the photon mean path length and photon absorption probability as shown in FIG. 3. The variation in the refractive index of the nano-needles compared to air and the absorbing layer, coupled with the texture of the layer, further enhances light scattering/light trapping. The index of refraction difference between Sn-rich SnO and air additionally lends itself to good antireflective properties, which minimize reflection losses as shown in FIG. 3. Antireflection comes from the destructive interference between two electromagnetic waves phase-shifted by $n\pi$, where n is an odd integer number. Antireflection is controlled by varying the MO thickness such that the frequency phases between light at the air-MO interface and light reflected at the MO-solar absorbing layer interface are shifted by $n\pi$. In the Sn-rich SnO thin film, reflectivity was measured to be <15% in the wavelength range of 520 nm to 800 nm without thickness optimization.

In some embodiments, metal-rich metal oxides exhibit increased electrical conductivity. Electrons propagating through amorphous materials experience severe scattering due to the materials' short-range ordering, thereby reducing electron mobility. In a crystalline material, electron mobility is increased due to longer-range order. Metal-rich metal oxide nanostructures provide a polycrystalline interface through which electrons can travel with greater mobility than through amorphous material. Additionally, metal nanostructures embedded in the MO crystal structure further enhance electrical conductivity. High electrical conductivity, $\sim 10^4$ S/cm, is demonstrated in Sn-rich SnO obtained at <250° C. This electrical conductivity exceeds that of F or Sb doped $SnO_2$ obtained at 450° C. ($1.6 \times 10^3$ S/cm) and is comparable to, if not better than, some of the leading TCO materials. (Alves, Lucas et al. High-Efficiency Solar Coatings. Depositions Sciences, Inc. Solar Novus Today, available at www.depsci.com/Documents/NewsRoom/DSI%20High-Efficiency%20Solar%20Coatings.pdf.)

In an embodiment, a transparent conductive oxide (TCO) material includes a metal-rich metal oxide having a formula $(M1, M2 \ldots Mn)_yO_x$, where M1, M2 and Mn are the same metal or different metals and a molar ratio of y:x is selected from a range of 0.1 to 20, or a molar ratio of y:x is selected from a range of 0.5 to 10, or a molar ratio of y:x is selected from a range of 1 to 5. Typically, the molar ratio of y:x is greater than 1. For example, a metal-rich metal oxide having a formula $(M1, M2 \ldots Mn)_yO_x$ has a stoichiometric ratio of M1, M2 and Mn combined (i.e., M total) to oxygen that is y to x. A stoichiometric ratio of M1 to M2, for example, may vary such that the molar ratio is greater than, equal to, or less than 1. In an embodiment, x is between 1 and 4 and y is between 1 and 3. In an embodiment, n equals 0 when the metal-rich metal oxide contains two metals (M1 and M2, which may be the same or different).

In an embodiment, at least two of M1, M2 and Mn are the same metal, such as tin in Sn-rich SnO, zinc in Zn-rich ZnO, or indium in In-rich $In_2O_3$. In an embodiment, at least two of M1, M2 and Mn are different metals, such as Sn and Zn in Sn-rich ZnO or Zn-rich SnO. Suitable metal oxides include but are not limited to metal oxides selected from the group consisting of $Zn_yO_x$, $Cd_yO_x$, $Sn_yO_x$, $In_yO_x$, indium doped tin oxide (ITO), fluorine doped tin oxide (FTO), aluminum doped zinc oxide (AZO), copper doped tin oxide, iron doped tin oxide, manganese doped tin oxide and combinations thereof.

In an embodiment, the metal-rich metal oxide material is a nanostructured material. The nanostructured material may, for example, be polycrystalline with domains of amorphous material and domains of crystalline material, such as crystalline needle-like nanostructures, or crystalline rhomboid nanostructures, or crystalline parallelogram nanostructures, or crystalline conical structures, or crystalline pyramidal nanostructures. In an embodiment, the nanostructures have a width between 5 nm and 1000 nm, or between 5 nm and 750 nm, or between 5 nm and 500 nm, or between 50 nm and 250 nm, or between 75 nm and 150 nm and a length between 20 nm and 5000 nm, or between 50 nm and 3000 nm, or between 100 nm and 2000 nm, or between 200 nm and 1000 nm, or between 400 nm and 750 nm. In an embodiment, the nanostructures have a width of 100 nm and a length of 500 nm. In an embodiment, the nanostructures are oriented randomly in a horizontal xy-plane through a thin film of the metal-rich metal oxide. In an embodiment, the electrical conductivity of the crystallized nanostructures is ~$10^4$ S/cm, or greater than $10^4$ S/cm, or between $10^3$ S/cm to $10^6$ S/cm, or between $10^4$ S/cm to $10^5$ S/cm.

In an embodiment, a metal-rich metal oxide material comprises metallic plasmonic nanostructures.

The optical and electrical properties of the TCO metal-rich metal oxide material are important for determining the functionality of the material. In an embodiment, a difference in index of refraction between the metal-rich metal oxide and air is 0.1 to 5, or 0.3 to 3, or 0.5 to 2, or 0.7 to 1.5. In an embodiment, the reflectivity of the metal-rich metal oxide is less than or equal to 25%, or less than or equal to 15%, or less than or equal to 10%, or less than or equal to 5% in a wavelength range between 520 nm to 800 nm. In an embodiment, a metal-rich metal oxide material has a light trapping capability at least 5% greater than indium doped tin oxide.

In some embodiments, a metal-rich metal oxide forms a film having a thickness less than or equal to 500 nm, or less than or equal to 250 nm, or less than or equal to 100 nm, or less than or equal to 50 nm, or less than or equal to 20 nm. In some embodiments, the metal-rich metal oxide forms a film having a thickness selected from the range of 5 nm to 1000 nm, or selected from the range of 25 nm to 500 nm, or selected from the range of 50 nm to 250 nm, or selected from the range of 75 nm to 150 nm.

In an embodiment, the metal-rich metal oxide material is a Sn-rich SnO, or a Zn-rich SnO, or a Cd-rich SnO, or a In-rich SnO, or a Ta-rich SnO, or a Sn-rich $SnO_2$, or a Zn-rich $SnO_2$, or a Cd-rich $SnO_2$, or a In-rich $SnO_2$, or a Ta-rich $SnO_2$, or a Sn-rich ZnO, or a Zn-rich ZnO, or a Cd-rich ZnO, or a In-rich ZnO, or a Ta-rich ZnO, or a Sn-rich $In_2O_3$, or a Zn-rich $In_2O_3$, or a Cd-rich $In_2O_3$, or an In-rich $In_2O_3$, or a Ta-rich $In_2O_3$, or a Sn-rich CdO, or a Zn-rich CdO, or a Cd-rich CdO, or a Ta-rich CdO, or a Sn-rich TaO, or a Zn-rich TaO, or a Cd-rich TaO, or a In-rich TaO, or a Ta-rich TaO.

In an embodiment, a method of making a metal-rich metal oxide material includes the steps of co-depositing a metal and a stoichiometric metal oxide and annealing the deposited material above 100° C., or above 200° C., or above 225° C. In an embodiment, a molar ratio of the metal to metal oxide is greater than 1:1. In an embodiment, the step of annealing is a rapid thermal annealing (RTA) at about 300° C. for about 30 seconds. In an embodiment, the depositing step includes a process selected from the group consisting of physical vapor deposition (PVD), sputtering, evaporation, laser ablation, chemical vapor deposition (CVD), low pressure CVD, aerosol assisted CVD, metal organic CVD, reactive sputtering, atmospheric pressure CVD and combinations thereof. For example, the step of depositing may occur at a deposition rate selected from a range of 0.1 Å/min to 10 nm/s at thicknesses between 3 Å and 5 µm. In an embodiment, the steps of depositing and annealing occur in a reducing environment, an inert environment, an oxidizing environment, or ambient conditions. The reducing environment may, for example, comprise 5-100% $H_2$; the inert environment may, for example, comprise an atmosphere of a gas selected from the group consisting of $N_2$, Ar, He and Ne; and the oxidizing environment may, for example, comprise an oxygen content greater than or equal to 1%.

In an embodiment, the metal is Sn and the stoichiometric metal oxide is $SnO_2$, or the metal is Zn and the stoichiometric metal oxide is $SnO_2$, or the metal is Cd and the stoichiometric metal oxide is $SnO_2$, or the metal is In and the stoichiometric metal oxide is $SnO_2$, or the metal is Ta and the stoichiometric metal oxide is $SnO_2$, or the metal is Sn and the stoichiometric metal oxide is ZnO, or the metal is Zn and the stoichiometric metal oxide is ZnO, or the metal is Cd and the stoichiometric metal oxide is ZnO, or the metal is In and the stoichiometric metal oxide is ZnO, or the metal is Ta and the stoichiometric metal oxide is ZnO, or the metal is Sn and the stoichiometric metal oxide is CdO, or the metal is Zn and the stoichiometric metal oxide is CdO, or the metal is Cd and the stoichiometric metal oxide is CdO, or the metal is In and the stoichiometric metal oxide is CdO, or the metal is Ta and the stoichiometric metal oxide is CdO, or the metal is Sn and the stoichiometric metal oxide is $In_2O_3$, or the metal is Zn and the stoichiometric metal oxide is $In_2O_3$, or the metal is Cd and the stoichiometric metal oxide is $In_2O_3$, or the metal is In and the stoichiometric metal oxide is $In_2O_3$, or the metal is Ta and the stoichiometric metal oxide is $In_2O_3$, or the metal is Sn and the stoichiometric metal oxide is TaO, or the metal is Zn and the stoichiometric metal oxide is TaO, or the metal is Cd and the stoichiometric metal oxide is TaO, or the metal is In and the stoichiometric metal oxide is TaO, or the metal is Ta and the stoichiometric metal oxide is TaO.

In an embodiment, a method of making a metal-rich metal oxide material further includes a patterning step that isolates sections of crystal growth. For example, the patterning step may include applying energy to a confined area of a metal-rich metal oxide film, where the step of applying energy may include laser annealing, rapid thermal annealing, and/or application of an electrical voltage bias across the sample.

Patterning may be useful, for example, for directing, constraining, isolating or modifying an electrical, optical or electrooptical signal. For example, selective patterning, including patterning to achieve a selected spatial frequency of patterned areas, within a metal-rich metal oxide may induce constructive or destructive interference of an electrical, optical or electrooptical signal traveling with the metal-rich metal oxide. In an embodiment, patterning of a metal-rich metal oxide material may block transmission of an electrical, optical or electrooptical signal to particular components of a device. For example, in an embodiment, blocking transmission of signals may reduce or eliminate cross-talk between devices or device components. Alternatively, patterning may direct an electrical, optical or electrooptical signal toward a particular component of a device. For example, in an embodiment, light or electricity may be directed toward a light-harvesting component or toward a sensor that provides feedback related to a device parameter.

In an embodiment, the step of annealing includes providing an atmospheric gas selected to independently provide n-type conductivity or p-type conductivity. For example, where the atmospheric gas is $N_2$, Ar, $H_2$ or any combination thereof, the metal-rich metal oxide material exhibits n-type conductivity, and where the atmospheric gas is air, the metal-rich metal oxide material exhibits p-type conductivity.

In an embodiment, the step of annealing may be performed in a temperature range selected from 40° C. to 800° C., or selected from 60° C. to 600° C., or selected from 80° C. to 400° C. or selected from 100° C. to 300° C. In an embodiment, the voltage bias may be selected from a range of 1 V and 1 kV, or selected from a range of 50 V and 800 V, or selected from a range of 100 V and 500 V amplitude for DC or AC current. In an embodiment, laser annealing may be performed at a light intensity between 0.1 W/cm$^2$ and 500 MW/cm$^2$, or between 10 W/cm$^2$ and 5 MW/cm$^2$, or between 100 W/cm$^2$ and 5 kW/cm$^2$.

In an embodiment, a thin-film solar cell, includes an electrode, a transparent conductive oxide (TCO) disposed on the electrode, a solar absorbing layer disposed on the TCO, and a metal-rich metal oxide, having an average formula (M1, M2 ... Mn)$_y$O$_x$, where M1, M2 and Mn are the same metal or different metals and a molar ratio of y:x is selected from a range of 0.1 to 20, disposed on the solar absorbing layer. In an embodiment, a molar ratio of y:x is selected from a range of 0.5 to 10, or a molar ratio of y:x is selected from a range of 1 to 5. Typically, the molar ratio of y:x is greater than 1.

In an embodiment, a thin-film solar cell, includes an electrode, a solar absorbing layer disposed on the electrode, and a metal-rich metal oxide, having an average formula (M1, M2 ... Mn)$_y$O$_x$, where M1, M2 and Mn are the same metal or different metals and a molar ratio of y:x is selected from a range of 0.1 to 20, disposed on the solar absorbing layer. In an embodiment, a molar ratio of y:x is selected from a range of 0.5 to 10, or a molar ratio of y:x is selected from a range of 1 to 5. Typically, the molar ratio of y:x is greater than 1.

In an embodiment, a method of fabricating a thin-film solar cell includes the steps of providing an electrode, depositing a transparent conductive oxide (TCO) on the electrode, applying a solar absorbing layer on the TCO, and providing a metal-rich metal oxide, having an average formula (M1, M2 ... Mn)$_y$O$_x$ where M1, M2 and Mn are the same metal or different metals and a molar ratio of y:x is selected from a range of 0.5 to 20, on the solar absorbing layer.

In an embodiment, the solar absorbing layer is a material selected from the group consisting of amorphous silicon (a-Si), nanocrystalline silicon (nc-Si), polycrystalline silicon (p-Si), crystalline silicon (c-Si), cadmium telluride (CdTe), copper indium gallium selenide (CIGS), copper zinc tin sulfide (CZTS), copper zinc tin selenide (CZTSe), gallium arsenide (GaAs), gallium indium phosphide (GaInP$_2$), germanium (Ge), silicon germanium (SiGe), tin germanium (SnGe), dye-sensitized materials, quantum dot materials (CdS, CdSe, Sb$_2$S$_3$, PbS etc.), organic or polymer materials, and any hydrogenated variants (for example a-Si:H, nc-Si:H, SiGe:H etc.) and/or multijunction layer combinations therein (for example, GaAs and GaInP$_2$ multijunction layers, or a-Si:H, a-SiGe:H, nc-Si:H multijunction layers, etc.).

Multifunctional nanostructured metal-rich metal oxides and associated methods will now be described with reference to the following non-limiting examples.

Example 1

Fabrication Methods

Fabrication of metal-rich metal oxides first uses thin film deposition techniques to obtain a desired non-stoichiometric MO composition. M$_y$O$_x$ composition molar ratios (y:x) range from 0.05 to 20, or from 1 to 10, or from 1.5 to 5. Fabrication techniques include co-deposition of metal and stoichiometric metal oxide as a thin film; these deposition techniques include physical vapor deposition methods such as sputtering, evaporation or laser ablation, or chemical vapor deposition (CVD) methods such as low pressure CVD, aerosol assisted CVD, metal organic CVD and the like. Alternatively, a desired non-stoichiometric composition can be obtained by controlled chemical reactions during deposition, such as reactive sputtering or atmospheric pressure CVD. Thin-film deposition is achieved at deposition rates between 0.1 Å/min and 10 nm/s at thicknesses between 3 Å and 5 μm. Deposition and annealing can be conducted in a reducing environment (e.g. with 5-100% H$_2$), an inert environment (N$_2$, Ar, Ne, Xe), an oxidizing environment (>1% O$_2$), a vacuum (>10$^{-12}$ torr), high pressure (<10$^9$ torr) or under ambient conditions.

The second step in the fabrication of metal-rich metal oxides involves facilitating nanostructure self-assembly from the thin film. After the thin film is prepared, surface confining techniques, such as patterning, are optionally used to isolate sections of crystal growth. The material is then placed in a high enthalpy environment. This can be achieved through methods such as a temperature increase by annealing or rapid thermal annealing, by application of an electrical voltage bias across the sample, or by laser annealing. Annealing may be performed at any pressure between vacuum (>10$^{-12}$ torr) and high pressure (<10$^9$ torr), for example, between 10$^{-9}$ torr and 10$^7$ torr, or between 10$^{-7}$ torr and 10$^5$ torr, or between 10$^{-5}$ torr and 10$^3$ torr, or between 10$^{-3}$ torr and 100 torr, or at ambient pressure. Temperature ranges for all forms of annealing can be between 40° C. and 800° C., or between 60° C. and 600° C., or between 80° C. and 400° C., or between 100° C. and 300° C. Voltage biases can be adjusted between 1 V and 1 kV, or between 50 V and 800 V, or between 100 V and 500 V amplitude for DC or AC current. Light intensity for laser annealing can be between 0.1 W/cm$^2$ and 500 MW/cm$^2$, or between 10 W/cm$^2$ and 5 MW/cm$^2$, or 100 W/cm$^2$ and 5 kW/cm$^2$. Under these conditions, the metal-rich metal oxides form self-assembled, energetically favorable nanostructures. The self-assembled metal-rich metal oxide nanostructures can then be used for their desired applications.

Example 2

Multifunctional Nanostructured Sn-Rich SnO Transparent Conductive Oxide for Thin Film Solar Cells In this example a novel nanostructured Sn-rich SnO TCO material with significantly reduced processing temperature, higher electrical conductivity, and enhanced light-trapping capability compared to conventional $SnO_2$ TCO is demonstrated. The Sn-rich SnO was fabricated by co-sputtering Sn and $SnO_2$ with a molar ratio slightly larger than 1:1. The as-deposited film was amorphous with a thickness of ~100 nm. After regular furnace annealing in an $N_2$ environment above 225° C., crystalline needle-like SnO nanostructures were formed, as revealed by scanning electron microscopy (SEM) and X-ray diffraction. These self-assembled SnO nano-needles are approximately 100 nm wide and 500 nm long and they propagate substantially horizontally throughout the thin film in random orientations. Alternatively, rapid thermal annealing (RTA) was used to quickly grow SnO nano-needle crystals. XRD results indicate complete crystallization after RTA at 300° C. for 30 s. Since the SnO was Sn rich, XRD analysis further shows that Sn nanocrystals were formed after annealing due to Sn segregation according to the Sn—O phase diagram. The surface texture introduced by the SnO nano-needles and the plasmonic scattering from the Sn nanocrystals both enhance the light trapping capability of the Sn-rich SnO TCO layer. The electrical conductivity of the crystallized Sn-rich SnO was found to be ~$10^4$ S/cm, which is better than the best F or Sb doped $SnO_2$ obtained at 450° C. ($1.6 \times 10^3$ S/cm). Reflectivity measurements of the nanostructured Sn-rich SnO thin film showed a low reflectance of <15% in the wavelength range of 520 nm to 800 nm, without thickness optimization, making SnO needle-like nanostructures a potential candidate for an anti-reflection (AR) coating.

With its low processing temperature, high electrical conductivity, enhanced light trapping capability, and anti-reflection properties, the nanostructured Sn-rich SnO demonstrated in this example has the potential to serve the functions of a TCO layer, a light-trapping structure and an AR coating simultaneously on solar cells.

Example 3

Self-Assembled Sunlight-Trapping Nanostructures
Background

The cost/kilowatts-generated of thin-film solar cells has been decreasing steadily over the past several decades[1] which has made the technology more economically favorable. Some estimates expect the thin-film solar cell market to grow faster than wafer photovoltaics.[2,3]

Light-trapping, a technique which reduces material costs, increases the light path length through a solar cell.[4] Typically surfaces are also textured with randomly dispersed or periodic nanoparticles to produce scattering to compliment light-trapping. Significant improvements in these attributes can be found primarily in the design and properties of transparent conductive oxide (TCO) layers.

$SnO_2$ in particular is a fascinating candidate for TCO applications because of its high optical transparency of up to 97%, moderately wide band gap of 3.6 eV, and a low resistivity of $10^{-6}$-$10^{-4}$ $\Omega m$.[5] However, $SnO_2$ films are amorphous as deposited. Crystallization, to improve electrical conductivity, occurs above 600° C. This is problematic because hydrogen to Si bonds in α-Si:H begin to break around 500° C., recreating dangling bonds in the photon-collecting region.

In this example, Sn-rich $SnO_2$ is used to lower the crystallization temperature of $SnO_2$ while maintaining its optical and electrical properties. Sn may improve $SnO_2$ crystallization, and increase carrier density and electrical conductivity while maintaining transparency.[6]

Methodology

Sn and $SnO_2$ were co-sputtered onto four inch, single-crystalline silicon (001) wafers. Films were sputtered using Sn:$SnO_2$ deposition ratios of 1:4, 1:2 and 1:1. Energy dispersive spectroscopy (EDS) results yielded 5%, 17% and 27% Sn/$SnO_2$ ratios respectively.

After cleaving into ~1 $cm^2$ pieces, samples were placed into a horizontal tube furnace using a quartz boat and tube. To prevent oxidation, $N_2$ was flowed over the sample which was also covered by a pure Si (001) wafer. Samples were annealed for between 15 to 30 minutes and between 300° C. and 600° C. in 25° C. to 50° C. increments.

Figure 4:
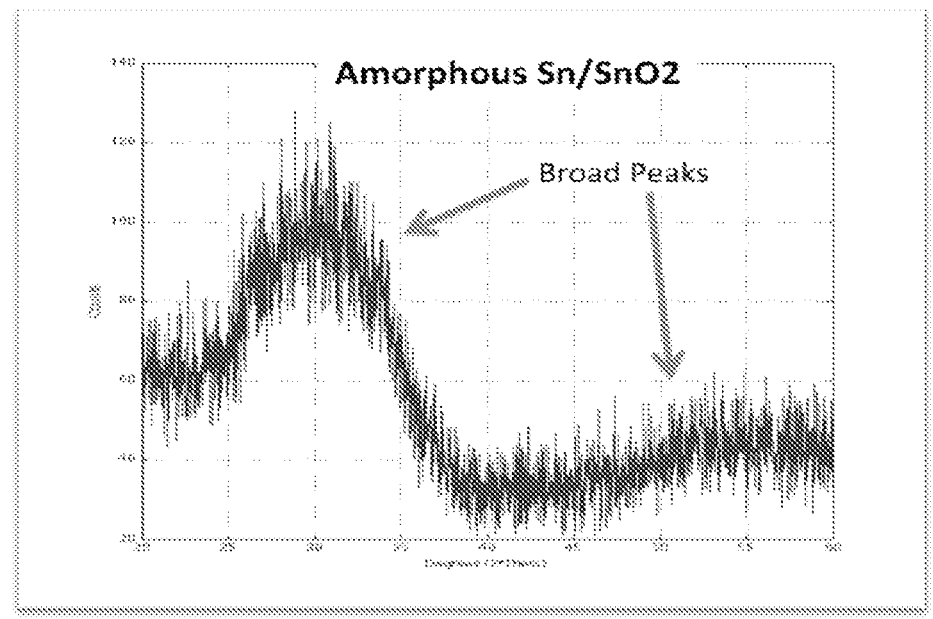
FIG. 4 shows an X-ray diffraction plot for amorphous $Sn/SnO_2$, according to an embodiment.
Figure 5:
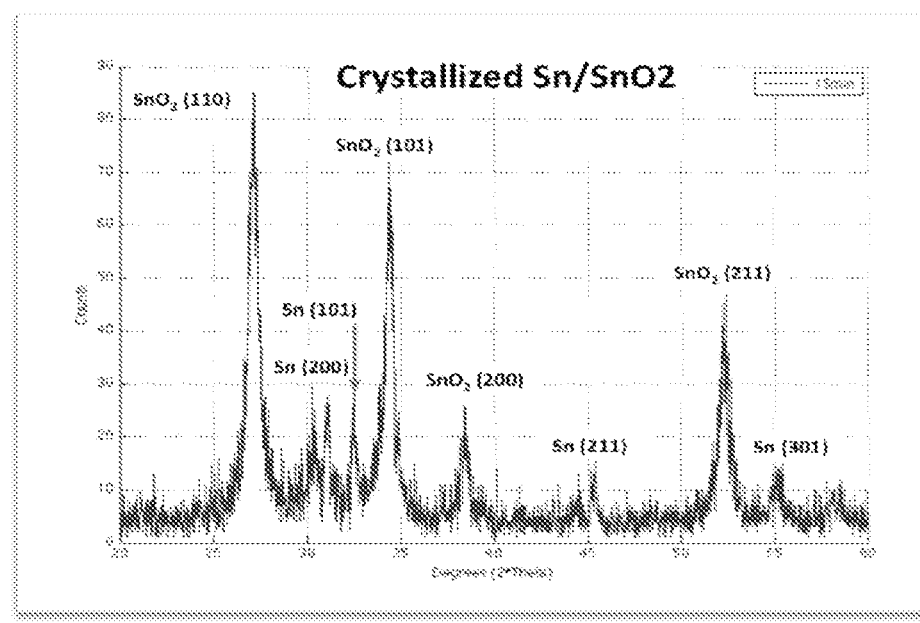
FIG. 5 shows an X-ray diffraction plot for crystallized $Sn/SnO_2$, according to an embodiment.

X-ray diffraction (XRD) was used to characterize the crystal structure and qualitatively analyze the transition temperature from amorphous to crystallized Sn/$SnO_2$ (see, e.g., FIGS. 4 and 5). Back-scattered electron (BSE) mode was used to visualize the segregation of Sn and $SnO_2$ in the crystal grains. The samples were also analyzed using a 4-point probe to determine the relationship between crystal structure and film conductivity.[6]

Results

Figure 6:
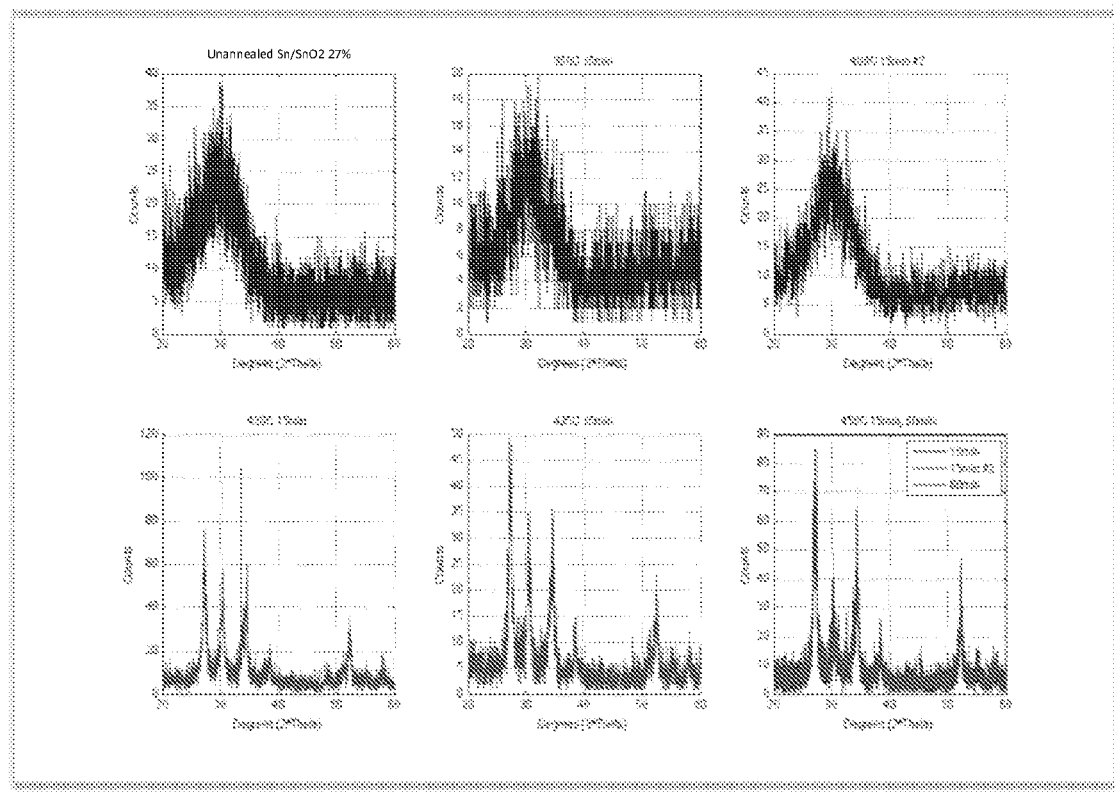
FIG. 6 shows X-ray diffraction patterns for $Sn/SnO_2$ 27% as a function of temperature, according to an embodiment.

For Sn/$SnO_2$ 5%, crystallization occurred between 400° C. and 450° C. and peak intensity did not increase significantly as either temperature or annealing time increased. For Sn/$SnO_2$ 17%, crystallization occurred between 400° C. and 425° C. Sn/$SnO_2$ 27% sees crystallization between 400° C. and 420° C. (see FIG. 6).

Images taken from the SEM shed more light on the mechanism of the Sn/$SnO_2$ crystallization process. Before annealing, the surface of all samples is so uniform it is very difficult to focus on any feature. However, after crystallization, granules of Sn can be seen on the surface, segregated out during the annealing process.

The presence of segregated Sn nanoparticles indicates that melted Sn is able to diffuse within the amorphous film, driving the crystallization of $SnO_2$. The Sn observed on the sample surface has segregated from the film and clumped together to minimize surface tension. These Sn features have the potential to act as light scatterers in a TCO film.

Figure 7:
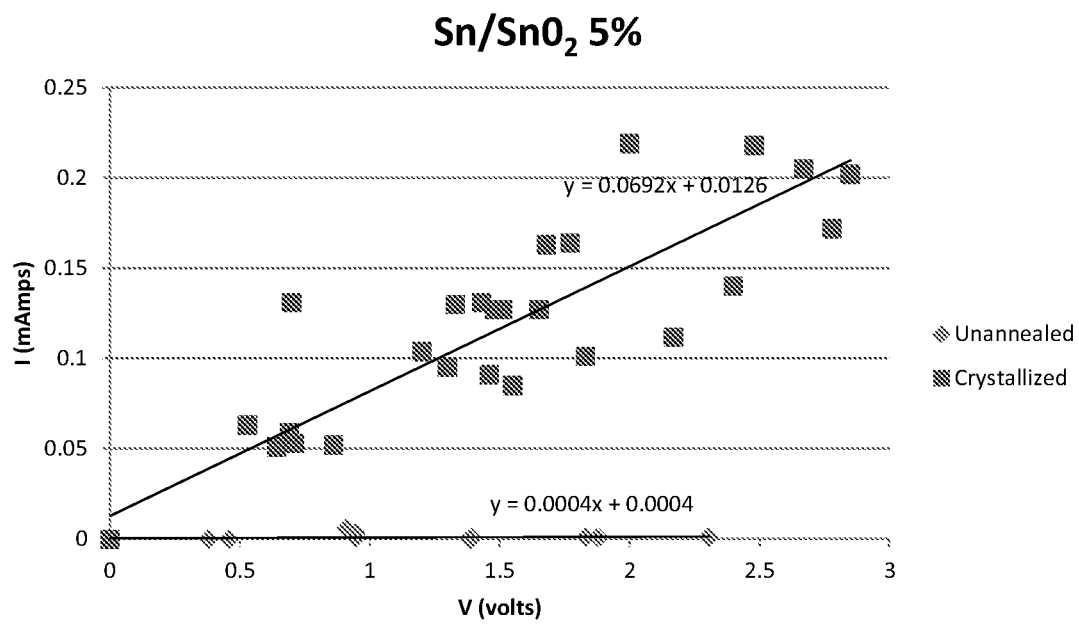
FIG. 7 shows a current versus voltage plot for $Sn/SnO_2$ 5% in amorphous and crystalline states, according to an embodiment.

For Sn/$SnO_2$ 5%, the conductivity of the amorphous film was 2/$\Omega m$ whereas the crystallized film conductivity was 346/$\Omega m$ (see FIG. 7). For the Sn/$SnO_2$ 17% film, amorphous conductivity was 6.5/$\Omega m$ and crystallized conductivity was 753.5/$\Omega m$. Finally for Sn/$SnO_2$ 27%, amorphous conductivity was 72.5/$\Omega m$ and crystallized conductivity was 437/$\Omega m$. The trend shows an increase in conductivity after crystallization.[6]

Discussion

Through this example, the successful formation of surface Sn scatterers through thin-film segregation of Sn-rich $SnO_2$ is demonstrated, as well as the capability to lower the crystallization temperature of $SnO_2$ to between 400° C. and 450° C.—a temperature range suitable to be used with a-Si:H. Finally, an increase in electrical conductivity after $SnO_2$ crystallization, which is compatible with theoretical expectations, has been shown. Thus, these materials have the potential to make significant improvements in the overall efficiency of photovoltaic devices as TCO layers for light scattering.

REFERENCES

1. Rockett, Angus A. The future of energy—Photovoltaics. Current Opinion in Solid State and Materials Science. V 14, I 6, December 2010, 117-122. Accessed May 28, 2012. www.sciencedirect.com/science/article/pii/S1359028610000471
2. Alpuim, Pedro. Thin film slicone solar cells and modules. Universidade do Minho, Department of Physics. Finland. RWE Schott Solar. March 2010. Accessed May 28, 2012. www.miics.net/archive/getfile.php?file=158.
3. Hoffmann, Winfried et. al. Thin films in photovoltaics: Technologies and perspectives. Thin Solid Films. 520 (2012) 4094-4100. April 2011. Accessed May 28, 2012. www.sciencedirect.com/science/article/pii/S0040609011009874.
4. Muller, Joachim et al. TCO and light trapping in silicon thin film solar cells. Solar Energy. V 77, I 6, December 2004, 917-930. Accessed May 28, 2012. www.sciencedirect.com/science/article/pii/S0038092X04000647.
5. Kili, etin and Zunder, Alex. Origins of Coexistence of Conductivity and Transparency in $SnO_2$. Physical Review Letters V 88, I 9. 4 Mar. 2002. National Renewable Energy Laboratory. Golden, Colo. Feb. 12, 2002. Accessed May 28, 2012. www.daedalus.caltech.edu/class/2010_aph114b/papers/ZungerTinOxide.pdf6.
6. Wong, Andrew. Self-Assembled Sunlight-Trapping Nanostructures. Thayer School of Engineering. Dartmouth College, Jun. 5, 2012.

Example 4

Multifunctional Nanostructured Sn-Rich SnO Transparent Conductive Oxide for Thin Film Solar Cells Background In thin film solar cells (TFSCs), transparent conductive oxides (TCOs) are commonly used as electrodes both above and below the solar absorbing region. $SnO_2$ doped with F or Sb is the most widely used TCO by area for many energy generation and electronic applications due to its low cost.

Light-trapping increases the optical path length of light through a solar cell, improving photon absorption in the solar absorbing region.[1] Typically, surfaces are also textured with nanoparticles to produce scattering, which compliments light-trapping. Improvements in these attributes is primarily in the design and properties of the TCO layers.

$SnO_2$ exhibits a low resistivity of $10^{-6}$-$10^{-4}$ $\Omega m$.[2] However, $SnO_2$ thin-films are amorphous as deposited and require crystallization to lower electrical resistivity. Currently, high quality $SnO_2$ requires a processing temperature of ~450° C., which limits its applications in amorphous Si (a-Si) and copper indium gallium selenide (CIGS) TFSCs.

Sn has a very low resistivity of 115 $n\Omega m$ at 0° C., a low melting temperature of 232° C., and Sn nanoparticles have light scattering properties. Therefore, it would be highly desirable to lower the $T_{crystallization}$, and to improve the electrical conductivity and light-trapping capability of $SnO_2$, by incorporating Sn nanoparticles.

Methodology

Sn and $SnO_2$ were co-sputtered onto a 4 inch single crystalline silicon wafer substrate. The $Sn:SnO_2$ molar ratio was varied by controlling the deposition rate. Films were nominally 100 nm thick. Samples were cleaved and annealed in a tube furnace or by rapid thermal annealing (RTA) using temperatures ranging between 200° C. and 450° C. in an inert environment ($N_2$) for 15 min in the tube furnace and (Ar) 30 s in the RTA.

Thin-film properties were characterized by EDS to determine material composition, XRD to study crystallization, 4-point probe to measure electrical conductivity, SEM to assess surface morphology, and spectrophotometer to measure transmittance and absorption.

Results

Figure 8:
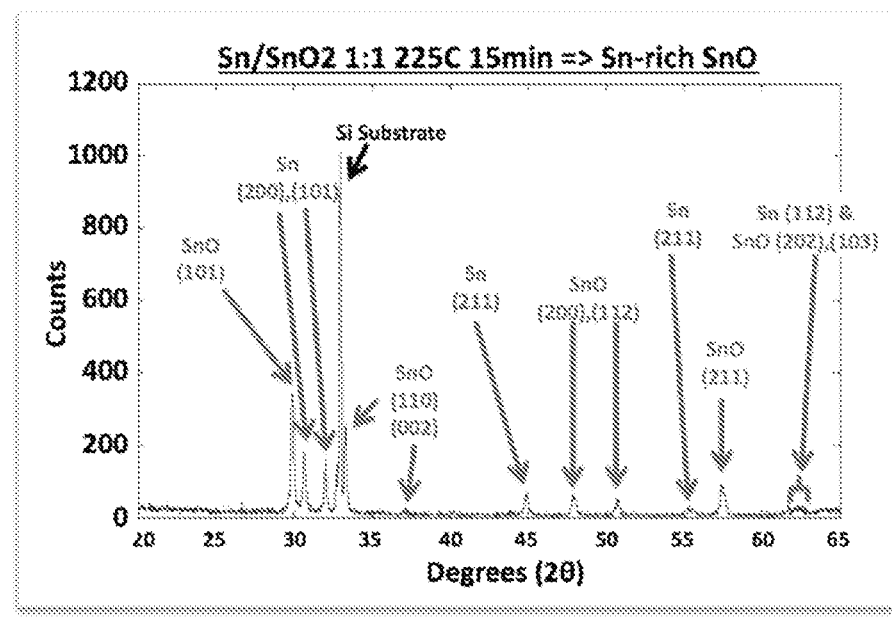
FIG. 8 shows X-ray diffraction results of an annealed 1:1 sample that yielded Sn and SnO (romarchite) peaks with no $SnO_2$ peak present, according to an embodiment.

EDS and XRD analysis showed a $Sn/SnO_2$ crystallization temperature lowered to 450° C. with Sn segregated from $SnO_2$ (FIGS. 4 and 5). At a molar ratio of approximately 1:1 ($Sn:SnO_2$ determined by EDS), crystallization occurred at 225° C. for 15 min and RTA 30 s at 300° C. XRD results of annealed 1:1 sample yielded Sn and SnO (romarchite) peaks with no $SnO_2$ peaks present (FIG. 8), called Sn-rich SnO.

Figure 9:
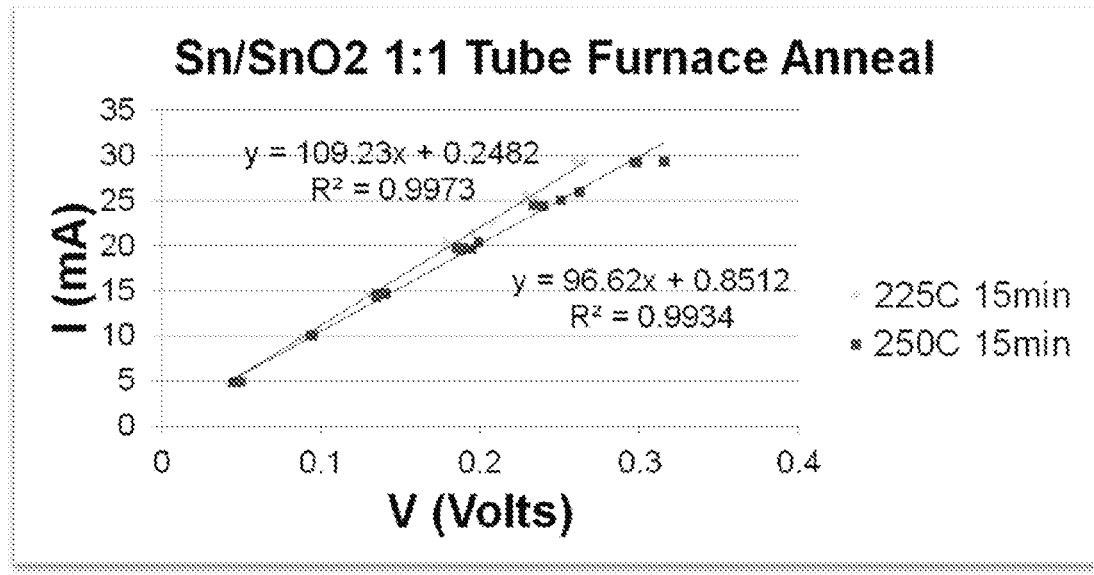
FIG. 9 shows 4-point probe measurements for Sn-rich SnO compositions annealed at 225° C. and 250° C., according to an embodiment.

4-point probe measurements yielded conductivity values of ~$10^4$ S/cm or a resistivity ~$10^{-6}$ $\Omega m$ for the Sn-rich SnO composition at 225° C. and 250° C. (FIG. 9). After this, conductivity decreases with increased temperature.

Figure 10:
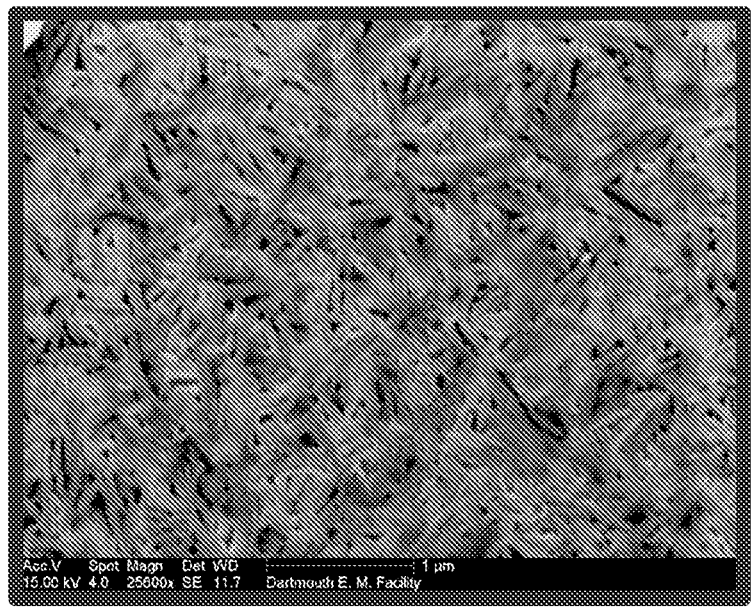
FIG. 10 shows an SEM image of surface morphology described as "nano-needles" or SnO nanostructures, approximately 100 nm wide and 500 nm long.
Figure 11:
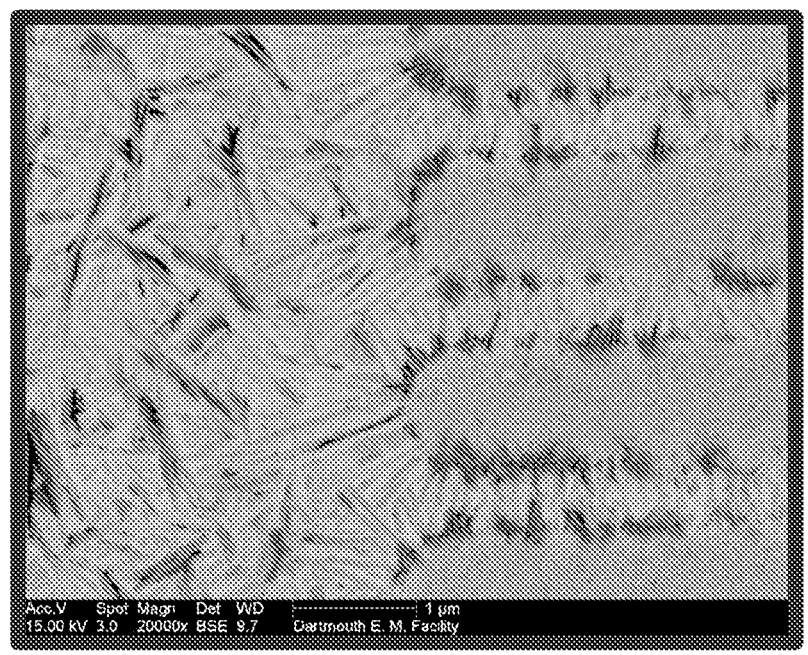
FIG. 11 shows that pre-annealing laser patterning modified the surface texture of the sample shown in FIG. 10.

SEM imaging showed a surface morphology described as "nano-needles" or SnO nanostructures, approximately 100 nm wide and 500 nm long (FIG. 10). Pre-annealing laser patterning was used to modify the surface texture (FIG. 11).

Figure 12:
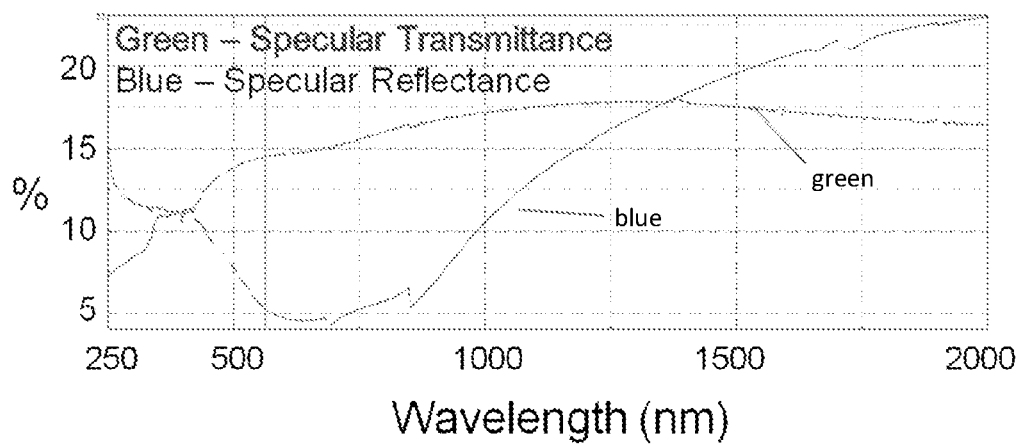
FIG. 12 shows spectrophotometer measurements for Sn-rich SnO showing specular reflectance and specular transmittance, according to an embodiment.

Spectrophotometer analysis of a Sn/SnO film showed low specular reflectance (green line) of <15% (FIG. 12) and specular transmittance (blue line) of <20% in the wavelength range of 520 nm to 800 nm, without thickness optimization.

Conclusions

Low reflectance and transmittance between 520 nm and 800 nm and a SnO band gap between 2.5 eV and 3 eV indicate that optical losses are primarily from scattering. Thus, Sn-rich SnO has potential as an optical scattering layer and as an antireflective coating. A low $10^{-6}$ $\Omega m$ resistivity comparable to state-of-the-art TCOs, such as ITO, and low 225° C. crystallization temperature extend Sn-rich SnO thin-film applications, for example making it compatible with a-Si and CIGS solar cells where the Sn-rich SnO thin-film can serve as a multifunctional nanostructured TCO for TFSC technologies. Fast, low temperature crystallization opens potential for commercial adoption, for example to improve performance and reduce the cost of TFSCs. Compatibility with laser patterning opens opportunities for confined crystal growth to modify optical and electrical properties. In a single ~100 nm layer, the Sn-rich SnO can serve as a strong electrical conductor, a light-trapping structure, and an anti-reflective coating.

REFERENCES

1. Muller, Joachim et al. TCO and light trapping in silicon thin film solar cells. Solar Energy. V 77, I 6, December 2004, 917-930. Accessed May 28, 2012. www.sciencedirect.com/science/article/pii/S0038092X04000647.
2. Kilic, Cetin and Zunger, Alex. Origins of Coexistence of Conductivity and Transparency in $SnO_2$. Physical Review Letters V 88, I 9. 4 Mar. 2002. National Renewable Energy Laboratory. Golden, Colo. Feb. 12, 2002. Accessed May 28, 2012.

Example 5

Crystallization of Sn-Rich Tetragonal SnO Thin Films

Background

Tin monoxide (SnO) has gained scientific interest due to its unique properties and wide variety of potential applications including as an anode candidate for lithium-ion rechargeable batteries,[1] as a material that exhibits superconducting properties,[2] as a material that demonstrates n-type and p-type conductor properties,[3] and as a transparent conductive oxide (TCO) for photovoltaics. Some of the challenges that remain for SnO include disproportionation to Sn and $SnO_2$ above 300° C.[4] and oxidation to $SnO_2$ at high temperatures.[5]

Sn-rich SnO films have unique properties including: rapid crystallization (<3 minutes at 210° C.), laser-patterned controllable growth, possible comproportionation reaction of the Sn—O system and promising optical, electrical and doping behavior. These properties encourage its application in optoelectronics.

Methods

Sn and $SnO_2$ were deposited on Si and $SiO_2$ substrates by magnetron sputtering. Select samples were patterned using a 514 nm laser and a translation stage. Samples were annealed in either a $N_2$ tube furnace between 200° C. and 400° C. for 15 minutes or an Ar rapid thermal annealed (RTA) oven at 300° C. for a few seconds.

Material composition was determined by energy dispersive X-ray (EDS), scanning electron microscopy (SEM), backscattered electron (BSE) and electron backscatter diffraction (EBSD) experiments. Material properties were characterized by four-point probe analysis (electrical conductivity), spectrophotometry (optical properties) and Hall-effect (doping concentration and mobility) measurements.

Results

Figure 13:
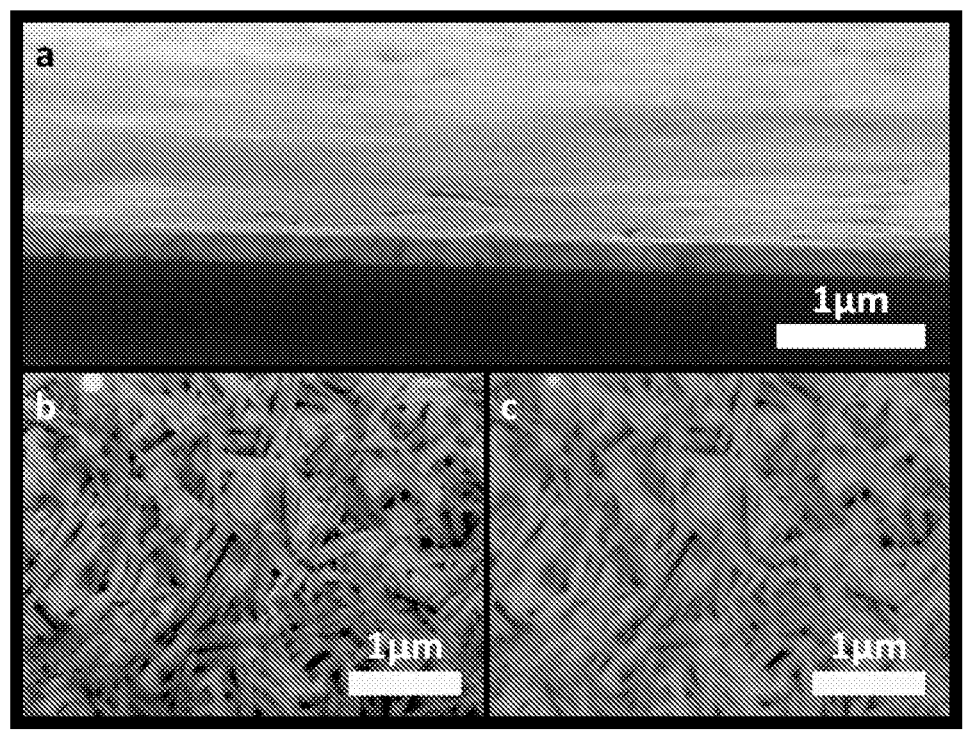
FIG. 13 shows (a) cross section image of Sn-rich SnO on Si showing 155 nm film thickness. (b) SEM. (c) BSE mode.
Figure 14:
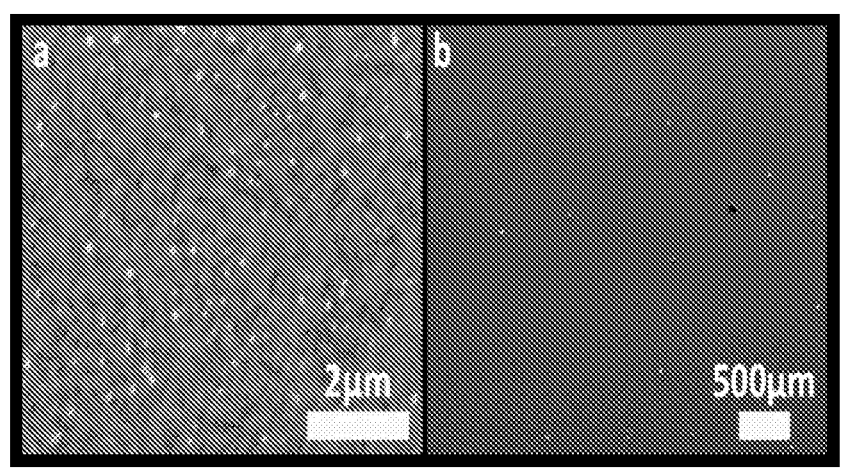
FIG. 14 shows (a) SEM with bright Sn segregation, (b) in situ, Sn droplets aggregate on surface.
Figure 15:
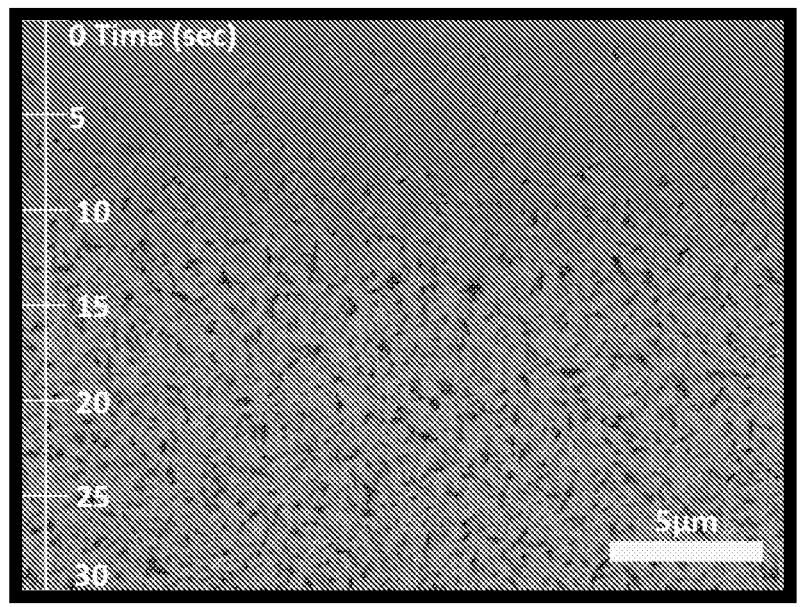
FIG. 15 shows a $Sn-SnO_2$ thin film annealed in situ on an SEM heating stage at ~300° C. Observation of surface morphology over 30 seconds shows rapid crystallization from amorphous Sn and $SnO_2$ to nanocrystalline Sn-rich SnO.

EDS analysis showed near 50:50 elemental composition of Sn and O. SEM and BSE images showed 155 nm thick SnO nano-needle-like morphology (FIG. 13 b,c). Sn particle size increases with temperature because of segregation at the surface (FIG. 14). FIG. 15 shows the stepwise crystal evolution of the Sn-rich SnO thin film at 210° C. Crystallization was observed in situ on an SEM heating stage. Rapid crystallization was observed within 15 seconds (FIG. 16) and between 5-30 seconds in RTA. Laser-patterned samples (FIG. 17a) annealed in an $N_2$ tube furnace crystallized except on patterned areas (FIG. 17b,c). EBSD confirms laser-patterned areas are amorphous, and show SnO crystal growth perpendicular to the pattern surface (FIG. 17d). Electrical resistivity measured by 4-point probe was $1.4 \times 10^{-4}$ Ω·cm competitive with the best TCOs today.[6,7] Spectrophotometry shows Sn-rich SnO thin films with a 3.0 eV optical band gap, consistent with literature values,[8] and low reflectance <15%. Hall effect measurements showed n- and p-type conductivity with high doping concentrations $\sim 10^{22}$/$cm^3$ when annealed in $N_2$ and vacuum respectively.

Discussion

In situ observations shed light on the crystallization mechanism of Sn-rich $SnO_2$ thin films. The ability to control crystal growth via patterning enables versatile applications, and the high n- and p-type doping expand the potential uses of Sn-rich SnO. For example, rapid, low temperature crystallization is ideal for temperature-sensitive electronic fabrication such as a-Si or CZTS solar cells. The excellent electrical conductivity, optical scattering and antireflective potential expand optoelectronic potential. Also, this is the first report of a comproportionation reaction occurring in TCO thin films.

REFERENCES

[1] M. Z. Iqbal, F. Wang, M. Y. Rafique, S. Ali, R. U. Din, M. H. Farooq, M. Khan, and M. Ali, "Synthesis and electrochemical properties of stannous oxide clinopinacoid as anode material for lithium ion batteries," *Journal of nanoscience and nanotechnology*, vol. 13, pp. 1773-9, March 2013.

[2] M. K. Forthaus, K. Sengupta, O. Heyer, N. E. Christensen, a. Svane, K. Syassen, D. I. Khomskii, T. Lorenz, and M. M. Abd-Elmeguid, "Superconductivity in SnO: A Nonmagnetic Analog to Fe-Based Superconductors?," *Physical Review Letters*, vol. 105, p. 157001, October 2010.

[3] J. B. Varley, a. Schleife, a. Janotti, and C. G. Van de Walle, "Ambipolar doping in SnO," *Applied Physics Letters*, vol. 103, no. 8, p. 082118, 2013.

[4] H. Giefers, F. Porsch, and G. Wortmann, "Kinetics of the disproportionation of SnO," *Solid State Ionics*, vol. 176, pp. 199-207, January 2005.

[5] J. Geurts, S. Rau, W. Richter, and F. Schmitte, "SnO films and their oxidation to SnO 2: Raman scattering, IR reflectivity and X-ray diffraction studies," *Thin solid films*, vol. 121, pp. 217-225, 1984

[6] P. D. C. King and T. D. Veal, "Conductivity in transparent oxide semiconductors," *Journal of physics. Condensed matter: an Institute of Physics journal*, vol. 23, p. 334214, August 2011.

[7] C. Granqvist and A. Hultå ker, "Transparent and conducting ITO films: new developments and applications," *Thin Solid Films*, vol. 411, pp. 1-5, 2002.

[8] M. Z. Iqbal, F. Wang, T. Feng, H. Zhao, M. Y. Rafique, M. H. Farooq, Q. U. A. Javed, and D. F. Khan, "Facile synthesis of self-assembled SnO nano-square sheets and hydrogen absorption characteristics," *Materials Research Bulletin*, vol. 47, pp. 3902-3907, November 2012.

Example 6

Improving Thin Film Solar Cell Efficiency with Nanostructured Sn-Rich SnO Transparent Conductive Oxide by Light Trapping

Background

Earth-abundant tin monoxide (SnO) has gained scientific interest due to its unique properties and wide variety of potential applications including as an anode in lithium-ion rechargeable batteries,[1] as a material that exhibits superconducting properties,[2] as a material that demonstrates n-type and p-type conductor properties,[3] as a transparent conductive oxide (TCO) for thin film solar cells (TFSCs) and as a p-type semiconducting oxide with a 2.7-3.4 eV optical bandgap.

Sn-rich SnO thin films have unique properties including: low temperature rapid crystallization (<3 minutes at 210° C.) that allows amorphous Si (a-Si) and copper zinc tin sulfide (CZTS) TFSC applications, laser-patterned controllable growth, comproportionation of the Sn—O system, textured SnO surfaces with Sn nanoparticles showing light scattering and antireflective properties, low electrical resistivity competitive with the state of the art TCOs,[4,5] and a unique doping behavior.

Methodology

Sn and $SnO_2$ were co-sputtered onto a 4 inch single crystalline silicon wafer substrate, then annealed under various conditions including a tube furnace in $N_2$ gas, between 200° C. and 400° C. for 15 minutes, or rapid thermal annealing (RTA) in Ar at 300° C. (450° C. max) for 60 seconds. After subjecting the samples to an SEM heating stage in vacuum (~$10^{-5}$ torr) for several minutes, select samples were patterned using wet etching, mechanical etching and a 514 nm laser.

Material composition was determined by energy dispersive X-ray (EDS), scanning electron microscopy (SEM), backscattered electron (BSE) and electron backscatter diffraction (EBSD) experiments. Material properties were characterized by four-point probe (electrical conductivity), spectrophotometry (optical properties), and Hall-effect (doping concentration and mobility) measurements.

Results

Figure 16:
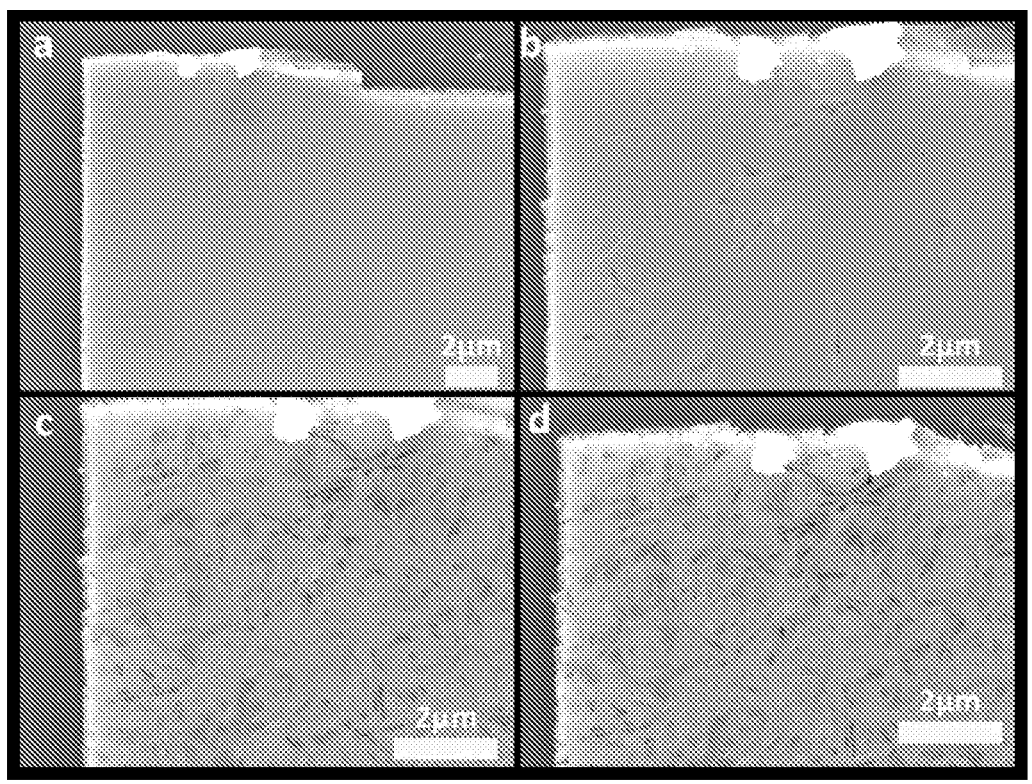
FIG. 16 shows in situ crystallization at (a) 200° C., showing no signs of crystallization (b) 210° C. for 1 minute and 30 seconds, (c) 210° C. for 3 minutes and 30 seconds, and (d) 210° C. for 8 minutes and 20 seconds. The crystallization is complete at ~3.5 minutes.
Figure 17:
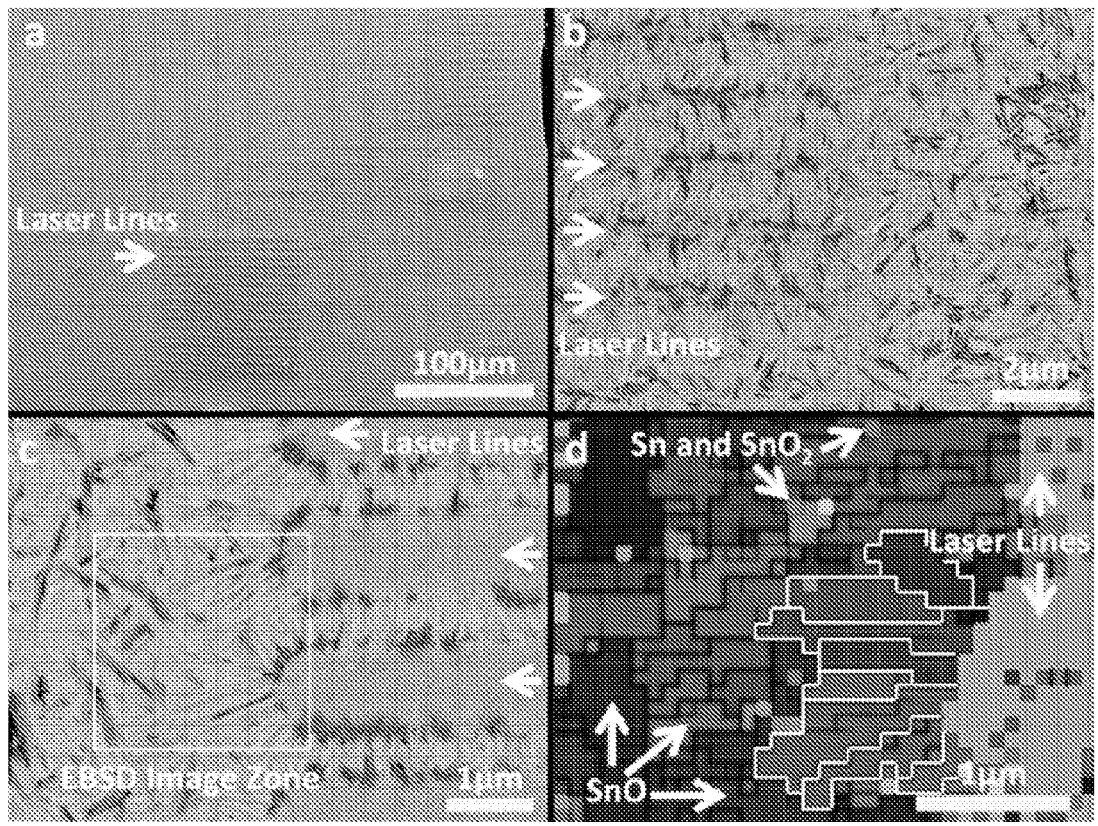
FIG. 17 shows SEM images of $Sn-SnO_2$ samples pre-annealed by a laser beam: (a) the pre-annealed laser patterning, (b) annealed in $N_2$ for 15 minutes at 225° C. Evenly spaced (~2 μm edge-to-edge spacing), narrow laser lines (~200 nm wide) are used to control crystal growth direction of SnO nano-needles with a relatively large areal fraction, (c) laser-patterning with a different laser line width of ~1 μm and an edge-to-edge line spacing of ~500 nm, (d) EBSD mapping of the region in the white box of (c). Laser line regions at the bottom right an top right are identified to be amorphous. SnO crystal grains (outlined) radiate perpendicular to the arc region of the laser lines. Sn and $SnO_2$ nanocrystals are randomly dispersed.

EDS analysis showed 49.6% Sn and 50.4% O elemental composition. XRD results showed strong (tetragonal) SnO and Sn peaks, as well as a characteristic Si substrate peak. SEM and BSE images showed 155 nm thick SnO nano-needle-like morphology (FIG. 13 b,c). As shown in FIG. 14, Sn particle size increases with temperature because of segregation at the surface. FIG. 15 shows the stepwise crystal evolution of the Sn-rich SnO thin film at 210° C. Crystallization was observed in situ on an SEM heating stage. Rapid crystallization was observed within 15 seconds (FIG. 16). Pre-annealing laser patterning was used to modify the surface texture (FIG. 17). Electrical resistivity measured by 4-point probe yielded a resistivity of $1.4 \times 10^{-4}$ Ω·cm for a 155 nm thick sample. After crystallization, conductivity decreases with increased temperature.

Figure 18:
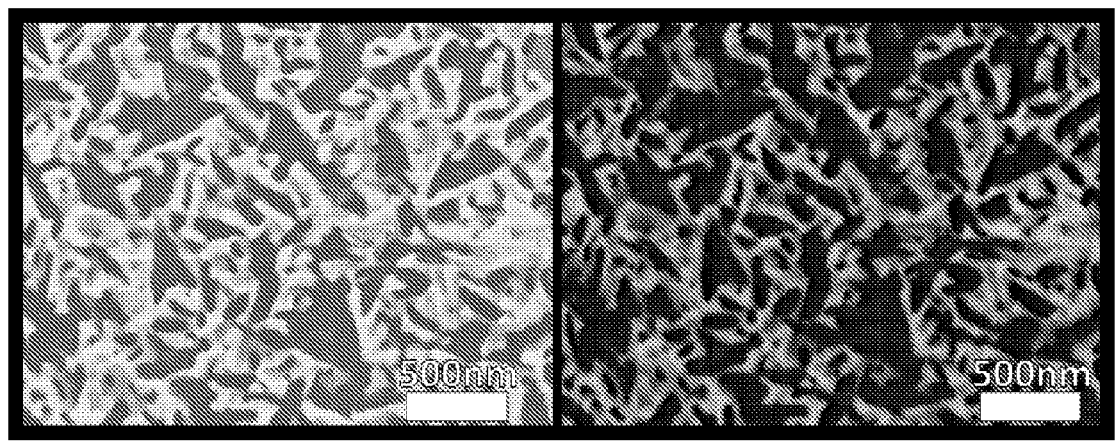
FIG. 18 shows SEM images of a Sn-rich SnO thin film annealed at 300° C. for 90 seconds and selectively etched in dilute HCl to remove SnO, leaving behind a metallic Sn network. (a) SE mode, (b) BSE mode.
Figure 19A:
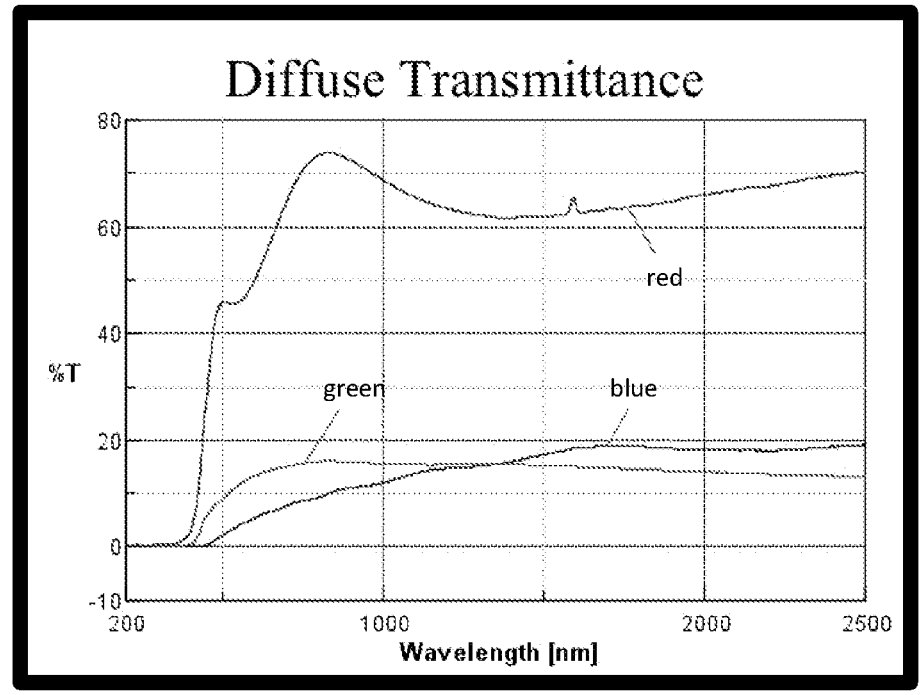
FIG. 19 shows (a) diffuse transmittance, (b) diffuse reflectance, and (c) calculated diffuse absorption (extinction) of Sn-rich SnO samples. (Blue—640 nm thin film on quartz, Green—155 nm thin film on quartz, Red—155 nm thin film annealed in air on quartz.)
Figure 19B:
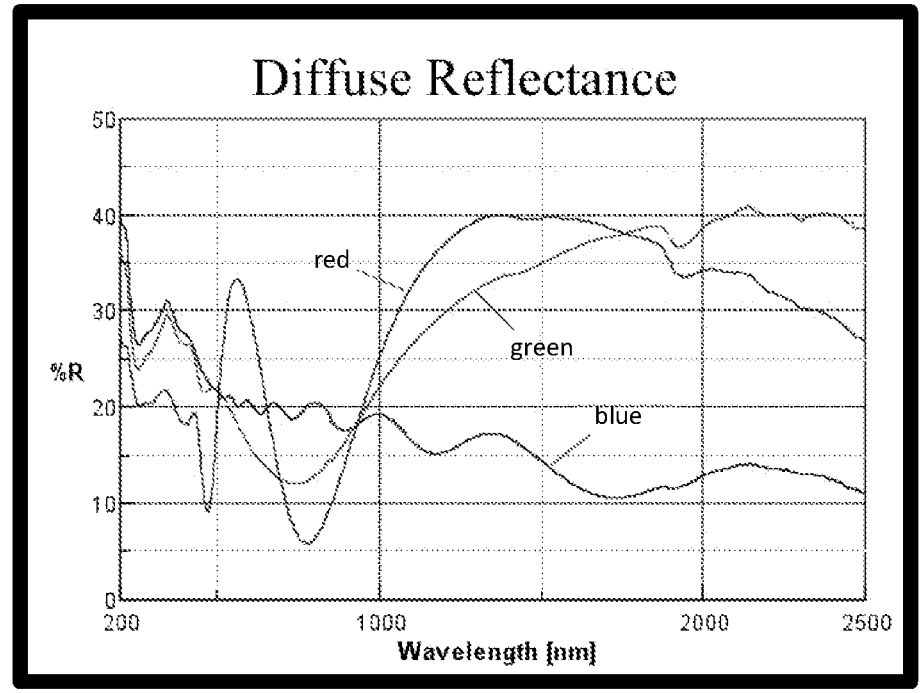
Figure 19C:
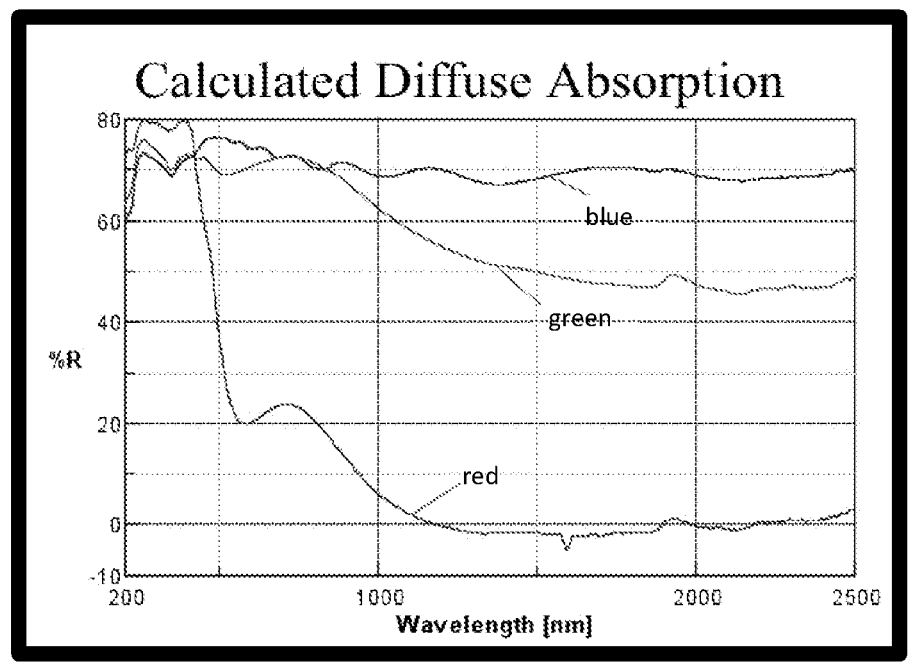

Spectrophotometry of a Sn/SnO film showed tunable transmittance based on annealing conditions (FIG. 19a) related to Sn embedded networks (FIG. 18). Transmittance was greatest for the sample annealed in air. Diffuse reflectance (FIG. 19b) shows interference behavior suggesting low thin film absorption. Calculated diffuse absorption (extinction) shows tunable absorption (FIG. 19c). Hall effect measurements showed n- and p-type conductivity with high doping concentrations ~$10^{22}$/cm$^3$ when annealed in N$_2$ and vacuum respectively. The n-type mobility was 0.69 cm$^2$/V/s and the p-type mobility was between 0.2 and 2.0 cm$^2$/V/s. Some N$_2$ samples showed n- and p-type behavior.

Conclusions

Rapid (<15 sec), low temperature (210° C.) crystallization extends Sn-rich SnO thin film applications, for example making it compatible with a-Si and CIGS solar cells where the Sn-rich SnO thin-film can serve as a multifunctional nanostructured TCO for TFSC technologies. Fast, low temperature crystallization opens potential for commercial adoption, for example to improve performance and reduce the cost of TFSCs. Low $1.4 \times 10^{-4}$ Ω·cm resistivity of Sn-rich SnO is comparable to state of the art TCOs, such as ITO. Compatibility with laser patterning opens opportunities for confined crystal growth to modify optical and electrical properties. Low reflectance and transmittance between 520 nm and 800 nm and a 3 eV optical band gap indicate optical scattering and antireflective properties. Hall effect measurements show high n- and p-type doping concentrations (~$10^{22}$/cm$^3$) with ~1 cm$^2$/V/s.

REFERENCES

[1] J. Pannetier and G. Denes, "Tin (II) oxide: structure refinement and thermal expansion," *Acta Crystallographica*, no. I, pp. 4-6, 1980.

[2] J. Köhler, J. Tong, R. Dinnebier, and A. Simon, "Crystal Structure and Electronic Structure of Red SnO," *Zeitschrift für anorganische und allgemeine Chemie*, vol. 638, pp. 1970-1975, October 2012.

[3] F. Izumi, "Pattern-fitting structure refine-ment of tin(II) oxide," *Journal of Solid State Chemistry*, vol. 38, pp. 381-385, July 1981.

[4] P. D. C. King and T. D. Veal, "Conductivity in transparent oxide semiconductors," *Journal of physics. Condensed matter*, vol. 23, p. 334214, August 2011

[5] C. Granqvist and A. Hultå ker, "Transparent and conducting ITO films: new developments and applications," *Thin Solid Films*, vol. 411, pp. 1-5, 2002.

Example 7

Comproportionation Growth of Conductive Sn-Rich Nano-Needle Tetragonal SnO Thin Films Tin monoxide (SnO) has become an important earth-abundant transparent conductive oxide (TCO) with applications not only in photovoltaics (PV), but also electrodes for energy storage. This example presents a method for making Sn-rich nano-needle SnO thin films through non-reactive co-sputtering of Sn and SnO$_2$ on silicon. Morphology, compositions, and crystallinity were characterized by scanning electron microscopy (SEM), energy dispersive X-ray (EDS), X-ray diffraction (XRD), and electron backscatter diffraction (EBSD). Crystallization occurred rapidly above 210° C., resulting in SnO nano-needles with average dimensions of 1.8 μm×0.1 μm interspersed with Sn nanocrystals. XRD confirmed the tetragonal phase of SnO. EDS indicates approximately 1:1 ratio of Sn and O both before and after annealing. Similar Sn:O atomic ratio before and after crystallization, no matter if annealed in N$_2$ ambient or vacuum, suggests the comproportionation reaction of SnO$_2$ and Sn to form SnO. While the detailed mechanism is under further investigation, the formation of nano-needles is likely facilitated by the diffusion of Sn at >210° C. It was also found that laser pre-patterning enabled control over nano-needle crystal size and growth directions. Optical measurements suggest that these nano-needle structures can be engineered to enhance optical scattering and light trapping in PV cells for stronger optical absorption. Electrical resistivity of the thin films was $6.4 \times 10^{-4}$ Ω·cm, comparable with the state of the art TCOs in tin oxide systems even without doping elements such as F. The fabrication temperature is also reduced by ~200° C. compared to SnO$_2$:F TCOs, which enables a broader range of applications in PV technology. Hall effect measurements show ambipolar behavior depending on the annealing ambient. When annealed in N$_2$ or Ar, the film exhibits n-type conductivity with free carrier concentrations >$10^{21}$ cm$^{-3}$ and carrier mobility ~1-10 cm$^2$ V$^{-1}$ sec$^{-1}$. These results indicate that the nano-needle SnO is a promising new material for earth-abundant TCOs in PV applications.

Background

Transparent conductive oxides (TCOs) have important applications in photovoltaics (PV) and flat panel display technologies. While indium tin oxide (ITO) had been the most popular TCO material, in recent years the low abundance and high cost of In has triggered research on earth-abundant TCO materials based on tin oxides. Fluorine-doped SnO$_2$ (SnO$_2$:F) has been a widely used TCO in tin oxide systems, yet low resistivity SnO$_2$:F requires a high fabrication temperature of 450° C., limiting its application in many PV technologies [1]. Recently, tin monoxide, also called stannous oxide, tin(II) oxide or SnO, has gained significant interest within the scientific community due to its unique properties and wide variety of potential applications. The tetragonal phase of SnO is also known as black SnO [2] or by its mineral form, romarchite, distinguishing it from the metastable, orthorhombic red SnO [3, 4]. Tetragonal SnO will be the focus of this example. Earlier studies revealed a high optical transparency of SnO in visible and near infrared spectral regimes with a large optical band gap of 3.3 eV [5]. Recent experiments have shown that nanocrystalline SnO without external doping exhibits p-type semiconducting behavior with an optical band gap of 2.7-3.4 eV [6]. Both n- and p-type doping have also been demonstrated in SnO [7]. These properties are highly useful for TCO applications. The high theoretical gravimetric capacity of SnO (875 mAh/g) also makes it a highly promising anode candidate for lithium-ion rechargeable batteries [8]. Furthermore, at high pressures and low temperatures it exhibits superconducting properties [9]. SnO also has uses as coatings and catalysts [10], and in applications such as photocatalysis [11], thin film transistors [12], electrochemical capacitors, [13], and solar energy storage [14].

Because of its promise in a variety of technological applications and because its functionality can be engineered by morphology, a significant amount of research has focused on synthesizing SnO into a number of dimensions and shapes. SnO morphologies include nanoparticles [15], powders [10] nanowhiskers [16], nanosheets [6], thin films [17], nanoplatelets [18], nanoribbons [19], nanoflowers [11], nanobelts and nanodendrites [20]. Additionally, many synthesis mechanisms have been employed including hydrothermal [6], solvothermal [10], vapor-liquid-solid (VLS) [20], thermal decomposition [21], chemical vapor deposition (CVD) [22], and reactive sputtering [23, 24] methods. For TCOs in PV applications, low-temperature fabrication, high electrical conductivity, and incorporation of nanostructures for effective light trapping in PV cells are highly desirable. However, for SnO these desirable features have not been achieved simultaneously in previous reports.

To enhance the optical and electrical properties of SnO at low processing temperatures, this example reports the fabrication of Sn-rich SnO thin films with a nano-needle like morphology crystallized from co-sputtered Sn and $SnO_2$ amorphous thin films upon annealing at 210-250° C. The rapid crystallization at these low temperatures is compatible with thin film semiconductor absorbers such as amorphous Si (a-Si) as well as low cost substrates such as soda lime glass. The thin films contained similar elemental compositions before and after crystallization, suggesting comproportionation of the Sn—O system where the identical element (Sn) of different oxidation states (i.e. Sn and $SnO_2$) reacts to reach the same intermediate oxidation state (SnO). These nano-needle structured Sn-rich SnO thin films exhibit excellent electrical conductivity and optical scattering properties for light trapping, which has promising applications in PV and other optoelectronic devices.

Methods

Sample Preparation

Deposition took place via magnetron co-sputtering of Sn and $SnO_2$ targets on silicon substrates (Ultrasil (100) p/B). Fused silica ($SiO_2$) substrates were used for optical and Hall effect measurements. Ar was flowed at 3 mTorr and the plasma was run at 100 W and 150 W for the Sn and $SnO_2$ targets respectively. The co-sputtering takes 13 minutes to reach a nominal film thickness of 1000 Å. The wafers were then cleaved into sample pieces. To create stepped interfaces for film thickness measurements, the samples were subjected to photolithography using Shipley 1813 photoresist and selectively etched in dilute HCl solution for several minutes until the substrate surfaces were exposed. Selected samples were pre-patterned using a 514 nm laser and a computer-controlled translation stage to investigate its effect on the crystallization process. Some samples were annealed in a tube furnace (Thermolyne F21100) in an inert $N_2$ environment at temperatures between 200° C. and 400° C. for 15 minutes. Other samples were rapid thermal annealed (RTA) (AG Associates Heatpulse 410 Rapid Thermal Processor) at 300° C. in Ar for several seconds or on an SEM-mounted heating stage (Fullam) in vacuum.

Characterization

Film thickness is determined by measuring the step height on the selectively etched thin films using interference microscopy (ADE Phase Shift MicroXAM-100 Interferometric Surface Profiler). It is also confirmed by cross-sectional scanning electron microscopy analysis (SEM, FEI XL-30 ESEM FEG). These two methods yielded consistent results. Thin film elemental composition was determined by energy dispersive X-ray spectroscopy (EDS) (EDAX Si(Li) detector with Genesis software). Morphology and topography of prepared thin films were characterized by SEM using secondary electron (SE) and backscattered electron (BSE) modes. Crystal structure and its spatial distribution were measured by X-ray diffraction (XRD) (Rigaku 007 X-ray Diffractometer) and by electron backscatter diffraction (EBSD) (HKL Channel5 system with Nordlys 2 detector).

Electrical conductivity was determined by four-point probe analysis (Signatone). UV-visible-infrared spectrophotometry (Jasco V570 Spectrophotometer) with an integrating sphere showed the diffuse reflectance of prepared SnO thin-films. Hall-effect measurements showed the free carrier concentration and carrier mobility in these films.

Results

Morphology and Composition

Prepared thin films were amorphous prior to annealing, confirmed by XRD. EDS compositional analyses were calibrated to a pure $SnO_2$ amorphous thin-film sample on silicon. With this calibration, the as-deposited films co-sputtered from Sn and $SnO_2$ had atomic compositions of 51.1 at. % Sn and 48.9 at. % O. Samples annealed in a tube furnace at 225° C. for 15 minutes in $N_2$ have atomic compositions of 49.3 at. % Sn and 50.7 at. % 0, suggesting negligible oxidation upon annealing. This composition point is near the phase transition regions among Sn, SnO, $SnO_2$ and $Sn_3O_4$ in the phase diagram, making this region particularly interesting for better understanding Sn—O phase transformation [25]. Film thickness was measured to be 155 nm by interference microscopy and also confirmed by cross section SEM analysis (FIG. 13a).

Figure 20:
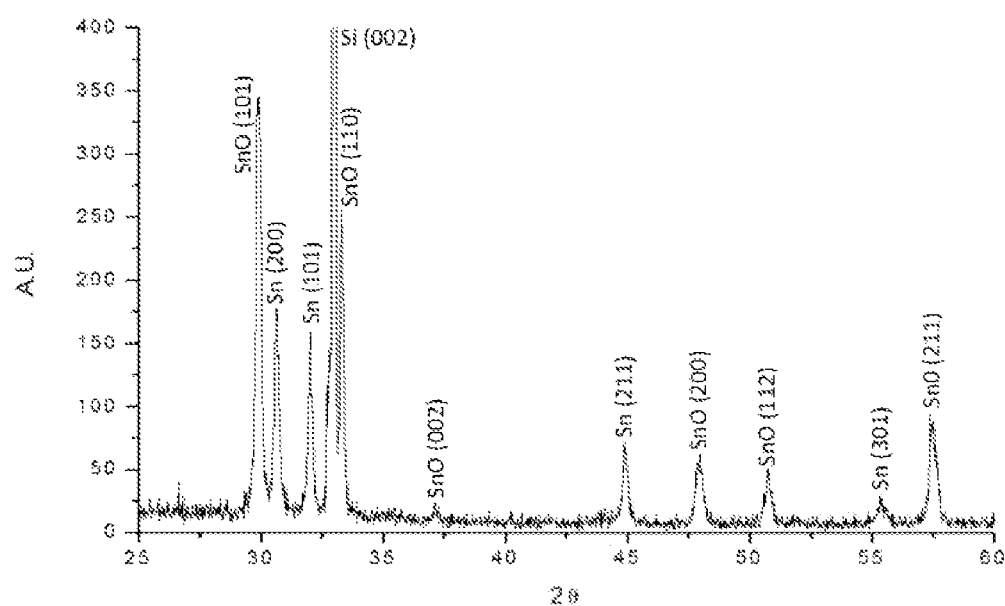
FIG. 20 shows a $Sn-SnO_2$ 155 nm thin film annealed at 225° C. in $N_2$ for 15 minutes. The overall Sn:O atomic ratio is ~1:1. XRD peaks including Sn, SnO and Si (substrate). The unit of the 2θ angle is degrees.

SEM images in SE and BSE modes show randomly dispersed nano-needle-like morphology for the films annealed at 225° C. in $N_2$ for 15 minutes (FIG. 13 b, c). XRD results from samples annealed between 225° C. and 400° C. show both Sn and SnO peaks (FIG. 20) without $SnO_2$ peaks. Because EDS shows ~1:1 ratio of Sn to O (i.e. the average composition is SnO) but XRD shows sizeable Sn peaks in addition to SnO peaks, these films may still contain some amorphous $SnO_2$ that has not completely reacted with Sn to form crystalline SnO. These two techniques suggest the thin film is composed of predominantly Sn-rich SnO nanostructures. SEM shows 1.8 µm long by 0.1 µm wide SnO nano-needle-like morphology. XRD full width half max (FWHM) measurements applied to the Sherrer equation indicates the formation of ~100 nm SnO nanocrystals annealed between 225° C. and 300° C. On the other hand, the size of Sn nanocrystals increases with annealing temperature according to XRD analysis such that at 400° C., Sn particles are 230 nm in diameter, larger than the initial film thickness. This is due to the surface segregation of Sn, since it becomes a liquid above 232° C. and diffuses readily, as confirmed by the observation of Sn segregates at the surface after annealing at 400° C. (FIG. 14a, bright dots correspond to Sn segregates).

Crystallization Mechanism

To investigate the kinetics of the crystallization process, we further performed both RTA annealing (Ar ambient) and in situ annealing in vacuum on a heating stage in SEM. RTA shows that the co-sputtered Sn—SnO$_2$ films crystallize rapidly upon annealing at >300° C. Samples annealed at 300° C. for 30 seconds by RTA showed identical XRD results and similar SEM topographic morphology to samples annealed in a tube furnace for 15 minutes in N$_2$. The rapid crystallization was also confirmed by an in situ observation of the crystallization process under SEM.

FIG. 15 shows the top to bottom in-time transition of the amorphous Sn—SnO$_2$ thin film to polycrystalline over the course of 30 seconds at ~300° C. during the in situ observation. Clearly, the crystallization is completed at about 15 sec. To observe the crystallization process in more detail, FIGS. 16a-d show the stepwise images of the in situ observation of the crystallization process by carefully approaching the lowest temperature required for crystallization (210° C.) to attain the slowest growth for imaging purposes. FIG. 16a shows the amorphous film at a mechanically etched corner held at 200° C. for several minutes. No crystallization occurs at this temperature. FIG. 16b shows the thin film 1.5 min after the first visible sign of crystallization at 210° C. FIG. 16c shows the crystallized film after 3.5 min at 210° C. and FIG. 16d shows the thin film after 8 min and 20 sec at 210° C. This finding indicates that crystal growth is completed after about three minutes at 210° C. XRD results showed near identical crystal structure compared to N$_2$ tube furnace annealed samples.

These findings indicate a narrow temperature range between no crystallization and rapid crystallization of the co-sputtered Sn—O system at an average initial composition of Sn:O~1:1. Since the crystallization temperature of 210° C. is close to the melting point of Sn (232° C.), it is likely that the rapid crystallization is facilitated by the diffusion of Sn. Using an Arrhenius equation and the time needed for crystallization at 210° C. and 300° C. from in situ observations, we estimate that this system has a relatively low activation energy of 65 kJ/mol (0.68 eV) for crystallization. Temperatures above 210° C. show little morphological variation, but annealing conditions have a significant impact on the electrical and optical properties of Sn-rich SnO thin films as described below. Therefore accurately controlled temperatures are required to optimize the functional properties of these materials.

What these in situ experiments also demonstrate is that SnO nanostructures can form in a vacuum from solid mixtures of Sn and SnO$_2$ without the presence of O$_2$ or ambient N$_2$. The only source of oxygen is from the SnO$_2$ molecules. This finding, coupled with the EDS result stated previously, strongly suggests that the crystallization and formation of SnO nanostructures results from the comproportionation reaction of Sn and SnO$_2$ solid solutions. The reaction is described by the equation:

$$Sn(0) + Sn(IV)O_2 = 2Sn(II)O \quad (1),$$

indicating an equilibrium oxidation state has been reached. The presence of excess Sn and amorphous SnO$_2$ suggests that the reaction was not driven to completion because Sn becomes physically separated from SnO$_2$ as the thin films crystallize.

Directionally-Controlled SnO Nano-Needle Growth by Laser Pre-Patterning

The nano-needle structure in Sn-rich SnO thin films mentioned earlier may have a significant impact on the optical and electrical properties. To investigate if the growth of the nano-needles could be controlled, samples were pre-patterned with a 514 nm laser as shown in FIG. 17a with varying scan rates and line widths. The focal spot size of the laser beam was between 200 nm and 1000 nm, and the optical power is ~3 mW. The aim was to induce localized, directed crystallization. EDS on laser-patterned areas shows identical elemental compositions to non-patterned regions. Atomic force microscopy (AFM) showed the patterned areas as depressions a few nanometers lower than the sample surface, but no indication of SnO crystallization (characterized by a drastic change in surface morphology) was present after laser patterning from SEM and AFM analysis. In fact, laser-patterned samples annealed in a N$_2$ tube furnace showed crystallization everywhere but on pre-patterned areas, as shown in FIGS. 17b and c. Laser patterning also resulted in local nano-needle crystal growth mostly perpendicular to the pattern lines as demonstrated in FIGS. 17c and d. FIG. 6b also demonstrates how this technique could be used to control the direction and size of SnO nano-needle structures with a larger areal fraction using narrower laser lines compared to FIG. 17c.

The EBSD results in FIG. 17d further confirm the amorphous structure of laser-patterned areas. Also, near the arc region of the laser lines (i.e. beginning/end of the lines), SnO crystal grains (outlined) mostly radiate perpendicular to the arc. Away from the laser lines SnO nanocrystals are randomly oriented. The EBSD crystal map also shows a few Sn and SnO nanocrystals randomly interspersed among the dominant tetragonal phase of SnO at the film surface. Selective etching of SnO in the thin film in a dilute HCl solution reveals residual Sn (FIG. 18), which is also confirmed by XRD. This suggests that SnO may act like an oxide shell around Sn nanostructures, explaining the identification of 100 nm thick Sn in the Sn-rich SnO thin film from XRD, but very few Sn hits on the EBSD surface mapping.

The mechanism for why laser-patterned areas show topographic depressions, no laser-induced crystallization, and no crystallization along with other regions on the sample when annealed requires further investigation. One hypothesis is that because SnO$_2$ is optically transparent at a laser wavelength of 514 nm, photons are only absorbed by Sn atoms, which locally heats them. This results in Sn diffusion from laser annealed regions towards those areas not exposed to laser lines. This diffusion would lead to a slight volume decrease, and correspondingly, a local depression at the laser annealed regions. On the other hand, the thermal energy provided by the laser absorption is not enough for the comproportionation reaction, thereby maintaining the amorphous phase of the tin oxide matrix. Additionally, Sn diffusion would cause the segregation of Sn from SnO$_2$ such that when the samples are furnace-annealed later, the local atomic composition of the laser-patterned areas would not be sufficient to drive the comproportionation reaction to crystalline SnO. Therefore, even after furnace annealing the laser pre-annealed regions do not exhibit crystallization of SnO.

Electrical and Optical Properties

Electrical resistivity measured by 4-point probe was 6.4× 10$^{-4}$ Ω·cm for samples annealed at 225° C. for 15 minutes in an N$_2$ tube furnace. At and below 200° C., thin films remained uncrystallized, and higher annealing temperatures after crystallization showed an increase in resistivity. Embedded Sn could contribute significantly to electrical conductivity. Lowering electrical resistivity with increasing temperature is consistent with the observation of Sn segregating from the thin film and aggregating on the sample surface at high temperatures (FIG. 14a). The hypothesis that Sn nanoparticles are located between SnO nanostructures contributing to electrical conductivity is also consistent with these results. The $6.4 \times 10^{-4}$ Ω·cm resistivity is comparable to the state of the art TCOs in production today [26, 27] while the fabrication temperature is ~200° C. lower than high-performance $SnO_2$:F TCOs [1]. The low resistivity and low fabrication temperature make these Sn-rich SnO thin films a promising electrode candidate in a broader range of applications.

Recent experiments on optical properties show the surface texture created by the SnO nano-needle structures and the plasmonic scattering from Sn nanoparticles enhance the light trapping capabilities of Sn-rich SnO thin film TCOs through optical scattering. Optical measurements show that Sn-rich SnO thin films have an optical band gap of 3.0 eV, consistent with literature values [4] and demonstrate low reflectance <15% in the wavelength range from 520 nm to 800 nm without thickness optimization. These findings suggest Sn-rich SnO nanostructures could provide antireflection (AR) properties.

Hall effect measurements showed an ambipolar behavior and a high carrier concentration for n-type Sn-rich SnO. The type of conductivity is affected by the annealing ambient conditions. The samples annealed in $N_2$ in a tube furnace and those annealed in Ar in an RTA furnace all exhibit n-type conductivity with free electron density n~$10^{22}$ cm$^{-3}$ and mobility $\mu_n$~2 cm$^2$ V$^{-1}$ sec$^{-1}$. The samples annealed in air, on the other hand, exhibit p-type behavior. It is possible that the n-type conductivity under $N_2$ or Ar annealing is related to O vacancies and/or excess Sn considering that the SnO is Sn-rich. Annealing in air tends to reduce the O vacancy and oxidize the excess Sn, leading to more stoichiometric SnO, which has been observed to be slightly p-type [7].

Conclusion

This example has demonstrated nano-needle structured Sn-rich tetragonal-SnO thin films for TCO applications. Elemental composition measurements by EDS and in situ observations of crystallization under vacuum strongly suggest these thin films crystallize rapidly via the comproportionation reaction of co-sputtered Sn and $SnO_2$ above 210° C. These thin films can be laser-patterned before annealing to control the size and growth direction of the SnO nano-needles. Crystallized Sn-rich SnO thin films demonstrate low electrical resistivity of $6.4 \times 10^{-4}$ Ω·cm, enhanced light scattering capabilities for light trapping due to the SnO nano-needles and plasmonic Sn nanoparticles, and potentials for antireflective coating applications. These properties make nano-needle structured Sn-rich SnO a promising TCO electrode candidate for thin film PV. The ambipolar behavior, depending on the annealing conditions, may greatly expand the applications of SnO and deepen the scientific knowledge of majority carrier types in TCOs. Together, these electrical and optical properties make Sn-rich SnO thin films promising TCO materials for a variety of applications.

REFERENCES

[1] E. Fortunato, D. Ginley, H. Hosono and D. C. Paine, MRS. Bulletin. 32 (2007) 242.
[2] J. Pannetier and G. Denes, Acta. Cryst. B 36 (1980) 2763.
[3] J. Köhler, J. Tong, R. Dinnebier, and A. Simon, Z. Anorg. Allg. Chem. 638 (2012) 1970.
[4] F. Izumi, J. Sol. State. Chem. 38 (1981) 381.
[5] R. Sivaramasubramaniam, M. Muhamad, and S. Radhakrishna, Phys. Stat. Sol. A 136 (1993) 215.
[6] M. Z. Iqbal, F. Wang, T. Feng, H. Zhao, M. Y. Rafique, M. H. Farooq, Q. U. A. Javed, and D. F. Khan, Mat. Res. Bull. 47 (2012) 3902.
[7] J. B. Varley, A. Schleife, A. Janotti, and C. G. Van de Walle, Appl. Phys. Lett. 103 (2013) 082118.
[8] M. Z. Iqbal, F. Wang, M. Y. Rafique, S. Ali, R. U. Din, M. H. Farooq, M. Khan, and M. Ali, J. Nanosci. Nanotechnol. 13 (2013) 1773.
[9] K. Forthaus, K. Sengupta, 0. Heyer, N. E. Christensen, A. Svane, K. Syassen, D. I. Khomskii, T. Lorenz, and M. M. Abd-Elmeguid, Phys. Rev. Lett. 105 (2010) 157001.
[10] Z. Han, N. Guo, F. Li, W. Zhang, H. Zhao, and Y. Qian, Mater. Lett. 48 (2001) 99.
[11] B. Liu, J. Ma, H. Zhao, Y. Chen, and H. Yang, Appl. Phys. A 107 (2012) 437.
[12] Y. Ogo, H. Hiramatsu, K. Nomura, H. Yanagi, T. Kamiya, M. Hirano, and H. Hosono, Appl. Phys. Lett. 93 (2008) 032113.
[13] M. M. Rao, M. Jayalaksmi, B. R. Reddy, S. S. Madhavendra, and M. L. Kantam, Chem. Lett. 34 (2005) 712.
[14] M. Forster, Energy 29 (2004) 789.
[15] D. Aurbach, A. Nimberger, B. Markovsky, E. Levi, E. Sominski, and A. Gedanken, Chem. Mater. 14 (2002) 4155.
[16] Z.-J. Jia, L.-P. Zhu, G.-H. Liao, Y. Yu, and Y.-W. Tang, Solid. State. Commun. 132 (2004) 79.
[17] X. Pan and L. Fu, J. Electroceram. 7 (2001) 35.
[18] S. Wang, S. Xie, H. Li, S. Yan, K. Fan, and M. Qiao, Chem. Commun. (2005) 507.
[19] Z. Wang and Z. Pan, Adv. Mater. 14 (2002) 1029.
[20] M. O. Orlandi, E. R. Leite, R. Aguiar, J. Bettini, and E. Longo, J. Phys. Chem. B 110 (2006) 6621.
[21] X. Xu, M. Ge, K. Ståhl, and J. Jiang, Chem. Phys. Lett. 482 (2009) 287.
[22] B. Kumar, D.-H. Lee, S.-H. Kim, B. Yang, S. Maeng, and S.-W. Kim, J. Phys. Chem. C 114 (2010) 11050.
[23] M. Soares, P. Dionisio, I. Baumvol, and W. Schreiner, Thin Solid Films 214 (1992) 6 [24] B. Stjerna, C. G. Granqvist, A. Seidel, and L. Häggström, J. Appl. Phys. 68 (1990) 6241.
[25] S. Cahen, N. David, J. Fiorani, A. Maitre, and M. Vilasi, Thermochim. Acta. 403 (2003) 275-285.
[26] P. D. C. King and T. D. Veal, J. Phys.: Condens. Matter. 23 (2011) 334214.
[27] C. Granqvist and A. Hultåker, Thin Solid Films 411 (2002) 1.

STATEMENTS REGARDING INCORPORATION BY REFERENCE AND VARIATIONS

All references cited throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, and method steps set forth in the present description. As will be obvious to one of skill in the art, methods and devices useful for the present methods can include a large number of optional composition and processing elements and steps.

When a group of substituents is disclosed herein, it is understood that all individual members of that group and all subgroups, including any isomers, enantiomers, and diastereomers of the group members, are disclosed separately. When a Markush group or other grouping is used herein, all individual members of the group and all combinations and subcombinations possible of the group are intended to be individually included in the disclosure. When a compound is described herein such that a particular isomer, enantiomer or diastereomer of the compound is not specified, for example, in a formula or in a chemical name, that description is intended to include each isomer and enantiomer of the compound described individually or in any combination. Additionally, unless otherwise specified, all isotopic variants of compounds disclosed herein are intended to be encompassed by the disclosure. For example, it will be understood that any one or more hydrogens in a molecule disclosed can be replaced with deuterium or tritium. Isotopic variants of a molecule are generally useful as standards in assays for the molecule and in chemical and biological research related to the molecule or its use. Methods for making such isotopic variants are known in the art. Specific names of compounds are intended to be exemplary, as it is known that one of ordinary skill in the art can name the same compounds differently.

It must be noted that as used herein and in the appended claims, the singular forms "a", "an", and "the" include plural reference unless the context clearly dictates otherwise. Thus, for example, reference to "a cell" includes a plurality of such cells and equivalents thereof known to those skilled in the art, and so forth. As well, the terms "a" (or "an"), "one or more" and "at least one" can be used interchangeably herein. It is also to be noted that the terms "comprising", "including", and "having" can be used interchangeably. The expression "of any of claims XX-YY" (wherein XX and YY refer to claim numbers) is intended to provide a multiple dependent claim in the alternative form, and in some embodiments is interchangeable with the expression "as in any one of claims XX-YY."

Unless defined otherwise, all technical and scientific terms used herein have the same meanings as commonly understood by one of ordinary skill in the art to which this invention belongs. Although any methods and materials similar or equivalent to those described herein can be used in the practice or testing of the present invention, the preferred methods and materials are described. Nothing herein is to be construed as an admission that the invention is not entitled to antedate such disclosure by virtue of prior invention.

Whenever a range is given in the specification, for example, a range of integers, a temperature range, a time range, a composition range, or concentration range, all intermediate ranges and subranges, as well as all individual values included in the ranges given are intended to be included in the disclosure. As used herein, ranges specifically include the values provided as endpoint values of the range. As used herein, ranges specifically include all the integer values of the range. For example, a range of 1 to 100 specifically includes the end point values of 1 and 100. It will be understood that any subranges or individual values in a range or subrange that are included in the description herein can be excluded from the claims herein.

As used herein, "comprising" is synonymous and can be used interchangeably with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" can be replaced with either of the other two terms. The invention illustratively described herein suitably can be practiced in the absence of any element or elements, limitation or limitations which is not specifically disclosed herein.

One of ordinary skill in the art will appreciate that starting materials, biological materials, reagents, synthetic methods, purification methods, analytical methods, assay methods, and biological methods other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the invention has been specifically disclosed by preferred embodiments and optional features, modification and variation of the concepts herein disclosed can be resorted to by those skilled in the art, and that such modifications and variations are considered to be within the scope of this invention as defined by the appended claims.

We claim:

1. A transparent conductive oxide (TCO) material comprising a Sn-rich SnO having a molar ratio of y:x selected from a range of 0.1 to 20, wherein the Sn-rich SnO has a greater than stoichiometric ratio of metal to oxygen,
   wherein the Sn-rich SnO comprises crystalline regions/ domains;
   and wherein the Sn-rich SnO further comprises a self-assembled nanostructure comprising nano-needles.

2. The TCO material of claim 1, wherein the molar ratio of y:x is greater than 1.

3. The TCO material of claim 1, wherein the molar ratio of y:x is greater than 0.5 to 10.

4. The TCO material of claim 1, wherein the nano-needles have a length selected from the range of 20 nm to 5000 nm and a width selected from 5 nm to 1000 nm.

5. The TCO material of claim 1, wherein the material comprises metallic plasmonic nanostructures.

6. The TCO material of claim 1, wherein a difference in index of refraction between the metal-rich metal oxide and air is selected from a range of 0.1 to 5.

7. The TCO material of claim 1, wherein reflectivity of the metal-rich metal oxide is less than or equal to 15% in a wavelength range that at least covers 520 nm to 800 nm.

8. The TCO material of claim 1, wherein the metal-rich metal oxide comprises a combination of amorphous and crystalline regions/domains.

9. The TCO material of claim 1, wherein the metal-rich metal oxide has a light trapping capability at least 5% greater than indium doped tin oxide.

10. The TCO material of claim 1, wherein the electrical conductivity of the TCO material is $10^4$ S/cm.

* * * * *